(12) United States Patent
Yanagawa

(10) Patent No.: US 6,466,491 B2
(45) Date of Patent: Oct. 15, 2002

(54) MEMORY SYSTEM AND MEMORY CONTROLLER WITH RELIABLE DATA LATCH OPERATION

(75) Inventor: Miki Yanagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/859,489

(22) Filed: May 18, 2001

(65) Prior Publication Data

US 2001/0046163 A1 Nov. 29, 2001

(30) Foreign Application Priority Data

May 19, 2000 (JP) ........................................ 2000-148480
May 29, 2000 (JP) ........................................ 2000-158336

(51) Int. Cl.$^7$ ................................................ G11C 7/00
(52) U.S. Cl. ........................................ 365/194; 365/233
(58) Field of Search ................................. 365/194, 233

(56) References Cited

U.S. PATENT DOCUMENTS 5,537,602 A * 7/1996 Kametani ................. 395/800
6,028,816 A   2/2000 Takemae et al. ............ 365/233

FOREIGN PATENT DOCUMENTS

| JP | 0038604 | * 3/1980 | ............ G11C/7/00 |
| JP | 10-228449 | 8/1998 | |

OTHER PUBLICATIONS

Betty Prince, "Semiconductor Memories", 1983, Wiley, 2$^{nd}$ edition, pp. 470–472.*

* cited by examiner

Primary Examiner—M. Tran
(74) Attorney, Agent, or Firm—Arent Fox Kintner Plotkin & Kahn

(57) ABSTRACT

A memory controller for controlling a memory that is connected thereto and outputs data of a double data rate together with a strobe signal includes a clock signal generation circuit which generates a clock signal supplied to the memory, and a data acquisition circuit which delays the strobe signal through feedback control that makes a delay substantially equal to a ¼ cycle of the clock signal, and which latches the data in response to a timing signal that is the delayed strobe signal.

20 Claims, 24 Drawing Sheets

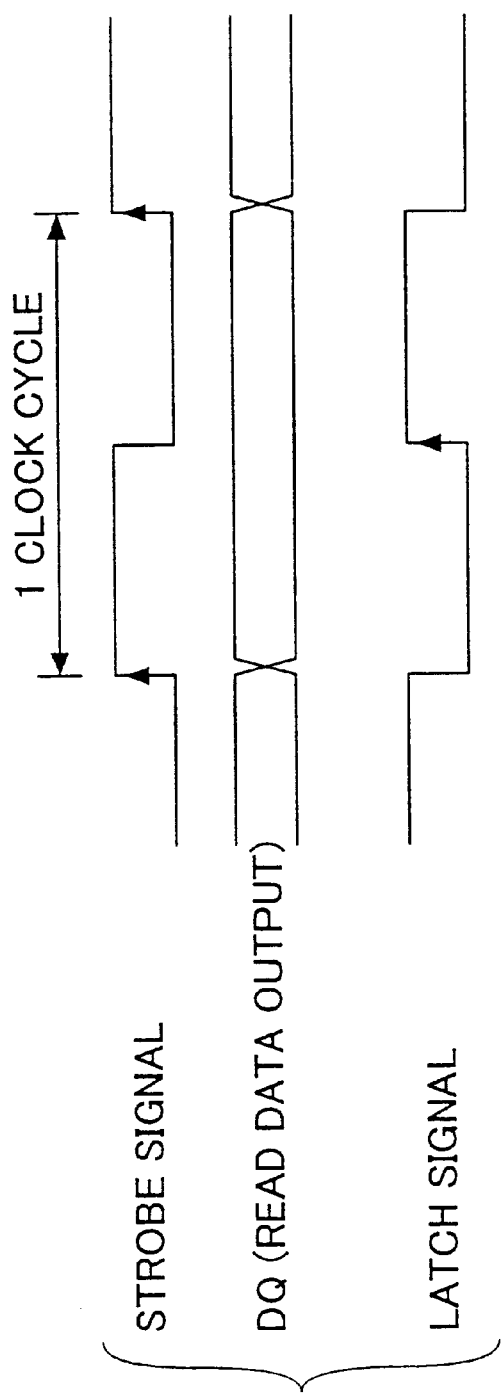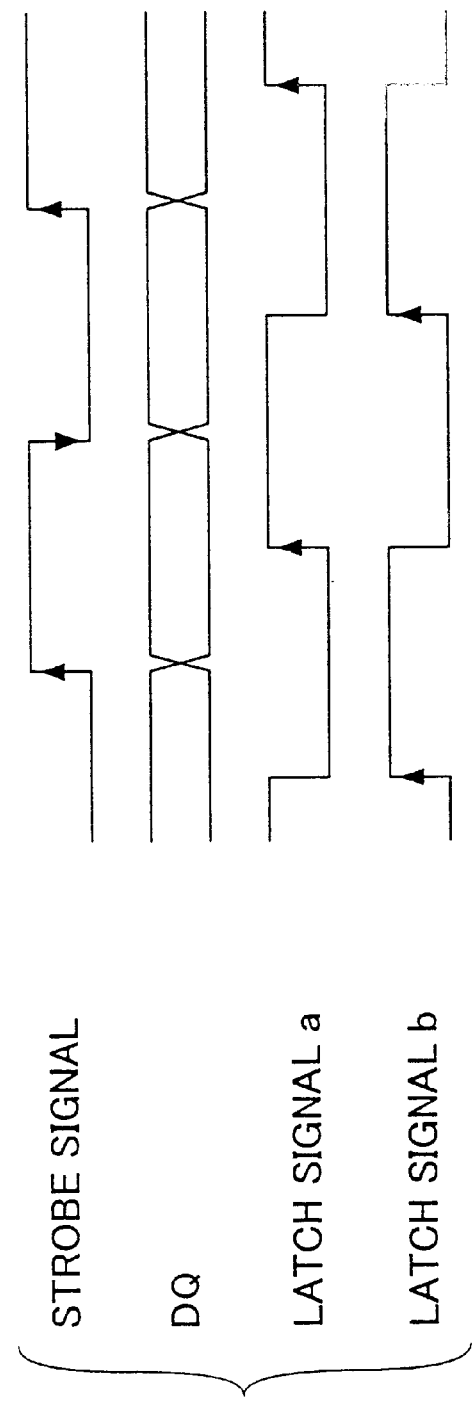

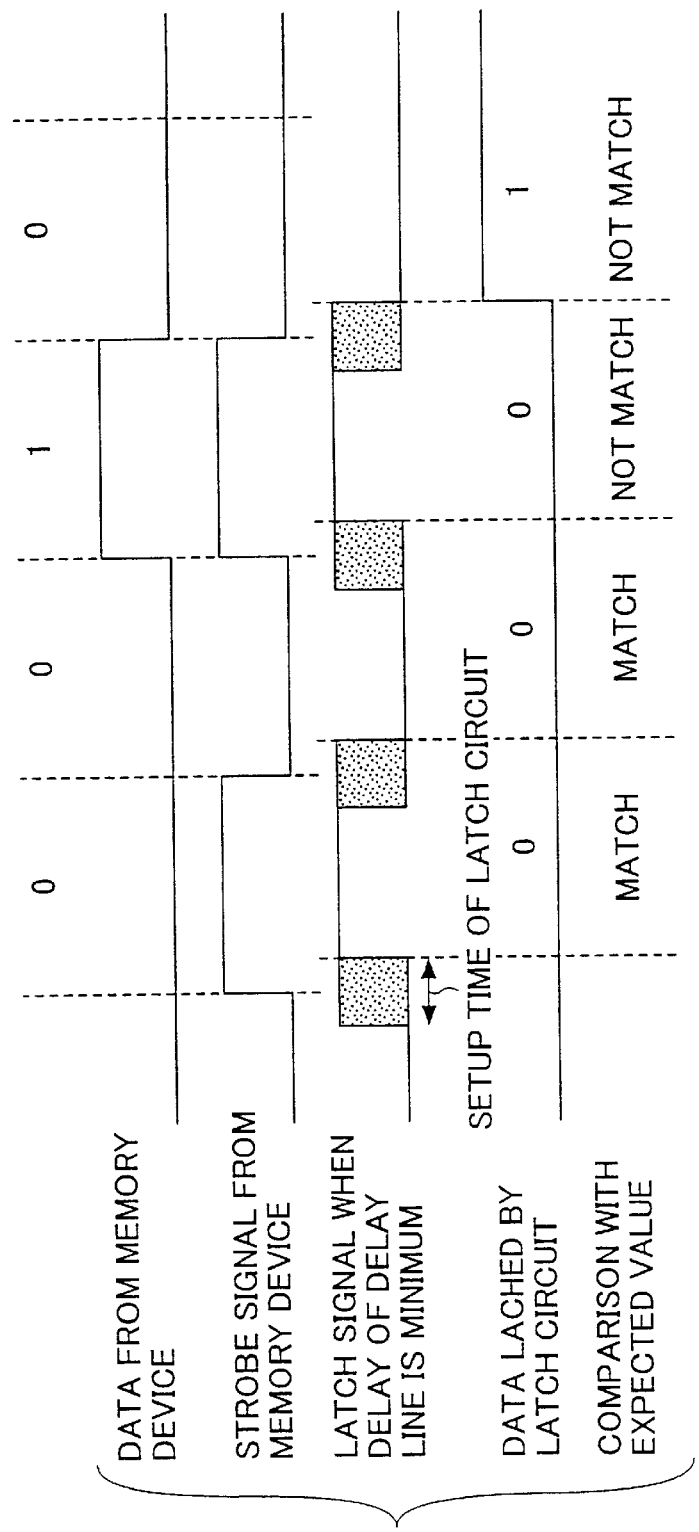

MEMORY SYSTEM AND MEMORY CONTROLLER WITH RELIABLE DATA LATCH OPERATION

BACKGROUND OF THE INVENTION

1. Field of the Invention

The present invention generally relates to a controller for a semiconductor memory device and a system comprised of a semiconductor memory device and a controller. The present invention particularly relates to a controller for a semiconductor memory device that outputs data of a double data rate together with a strobe signal, and relates to a system that controls data of a double data rate by a strobe signal.

2. Description of the Related Art

Semiconductor memory devices such as DRAMs that operate at a double data rate generally output data signals and a data strobe signal at the same phase timing, and keep data changes of the data signals at the same timing as the rising edges and falling edges of the strobe signal. A controller that is connected to a semiconductor memory device receives the strobe signal, and delays it by a proper time length. The controller takes in the data by latching the data signals by use of the delayed strobe signal.

In the controller, a delay circuit comprised of a series of inverters or the like is used to delay the strobe signal, thereby generating a timing signal for latching the data signals at optimum timing. If the delay of the delay circuit changes because of variation of manufacturing processes, fluctuation of ambient temperature or power supply voltages, etc., it would be difficult to maintain optimum timing for data acquisition. Namely, it would be difficult to maintain a proper data-hold time and a proper data-setup time for data acquisition.

Accordingly, there is a need for a controller connected to a semiconductor memory device wherein the controller can maintain optimum data acquisition timing even in the presence of various factors for timing fluctuation.

SUMMARY OF THE INVENTION

It is a general object of the present invention to provide a memory controller that substantially obviates one or more of the problems caused by the limitations and disadvantages of the related art.

It is another and more specific object of the present invention to provide a memory controller connected to a semiconductor memory device wherein the controller can maintain optimum data acquisition timing even in the presence of various factors for timing fluctuation.

In order to achieve the above objects according to the present invention, a memory controller for controlling a memory that is connected thereto and outputs data of a double data rate together with a strobe signal includes a clock signal generation circuit which generates a clock signal supplied to the memory, and a data acquisition circuit which delays the strobe signal through feedback control that makes a delay substantially equal to a ¼ cycle of the clock signal, and which latches the data in response to a timing signal that is the delayed strobe signal.

In the memory controller as described above, the timing signal used for the latching of the data is the delayed strobe signal that is delayed by a ¼ cycle of the clock signal, so that the data signal is latched at an exact midpoint between data change timings of the data signal, thereby providing an optimum data-hold time and an optimum data-setup time.

Further, since the delay is not provided as a fixed predetermined delay, but is controlled through feedback control to be a ¼ cycle of the clock signal, an optimum data acquisition timing is insured even in the presence of various variation factors such as variation of the manufacturing process, variation of ambient temperature, variation of a power supply voltage, etc. Moreover, the circuit size of the data acquisition circuit can be reduced by using an inverse of the clock signal and/or a signal having double a frequency of the clock signal as a reference signal for the feedback control.

Further, a system comprised of the memory controller as describe above and the memory of a double data rate can attain the same advantages as described above.

According to another aspect of the present invention, a memory system includes a memory device which outputs a strobe signal, and outputs data in synchronization with the strobe signal, a memory controller which includes a variable delay circuit that generates a latch signal by delaying the strobe signal, and latches the data in synchronization with the latch signal, and a delay selection unit which successively reads reference data of a given data value from the memory device while successively changing a delay of the variable delay circuit, and checks whether a value of the successively read reference data matches the given data value so as to obtain a range of the delay within which proper read operation is performed, thereby selecting the delay of the variable delay circuit based on the obtained range.

According to the memory system described above, a range of the delay of the variable delay circuit is obtained that allows data to be properly latched during an actual read operation, and the delay is set to an optimum delay within the obtained range, so that the memory system of the present invention can cope with any clock cycles, and is capable of a latch operation of optimum timing even if there is manufacturing variation, temperature variation, power-supply-voltage variation, etc. Further, since a plurality of variable delay circuits are not necessary, a simple circuit structure suffices to achieve its purposes. Moreover, the minimum adjustable delay of the variable delay circuit is equal to the delay of one delay stage, so that fine adjustment is possible despite the use of a simple circuit structure.

Further, the delay selection unit may be implemented as a microprocessor connected to the memory controller and a program executed by the microprocessor. This provides a simple configuration that can be readily achieved.

Moreover, the delay selection unit may be provided with a register that stores therein the reference data, which is written in the memory device via the memory controller, followed by being read from the memory device. Since the reference data is stored in the register, all that is necessary to check whether a proper read operation is performed is to compare the reference data read from the memory device with the data of the register.

The delay selection unit as described above may set the delay at the midpoint of the obtained range within which data can be properly latched. Further, the delay of the variable delay circuit is selected at a time of power-on of the memory system, and is maintained thereafter. Since there is a possibility that the delay deviates from the optimum delay as time passes, the delay of the variable delay circuit is selected at constant intervals, and is maintained until the next setting operation.

Other objects and further features of the present invention will be apparent from the following detailed description when read in conjunction with the accompanying drawings.

BRIEF DESCRIPTION OF THE DRAWINGS

FIGS. 13A and 13B are time charts showing relationships between read data, a strobe signal, and a latch signal;

FIG. 21 is a timing chart for explaining data read operations during a delay adjustment process;

DESCRIPTION OF THE PREFERRED EMBODIMENTS

In the following, embodiments of the present invention will be described with reference to the accompanying drawings.

Figure 1:
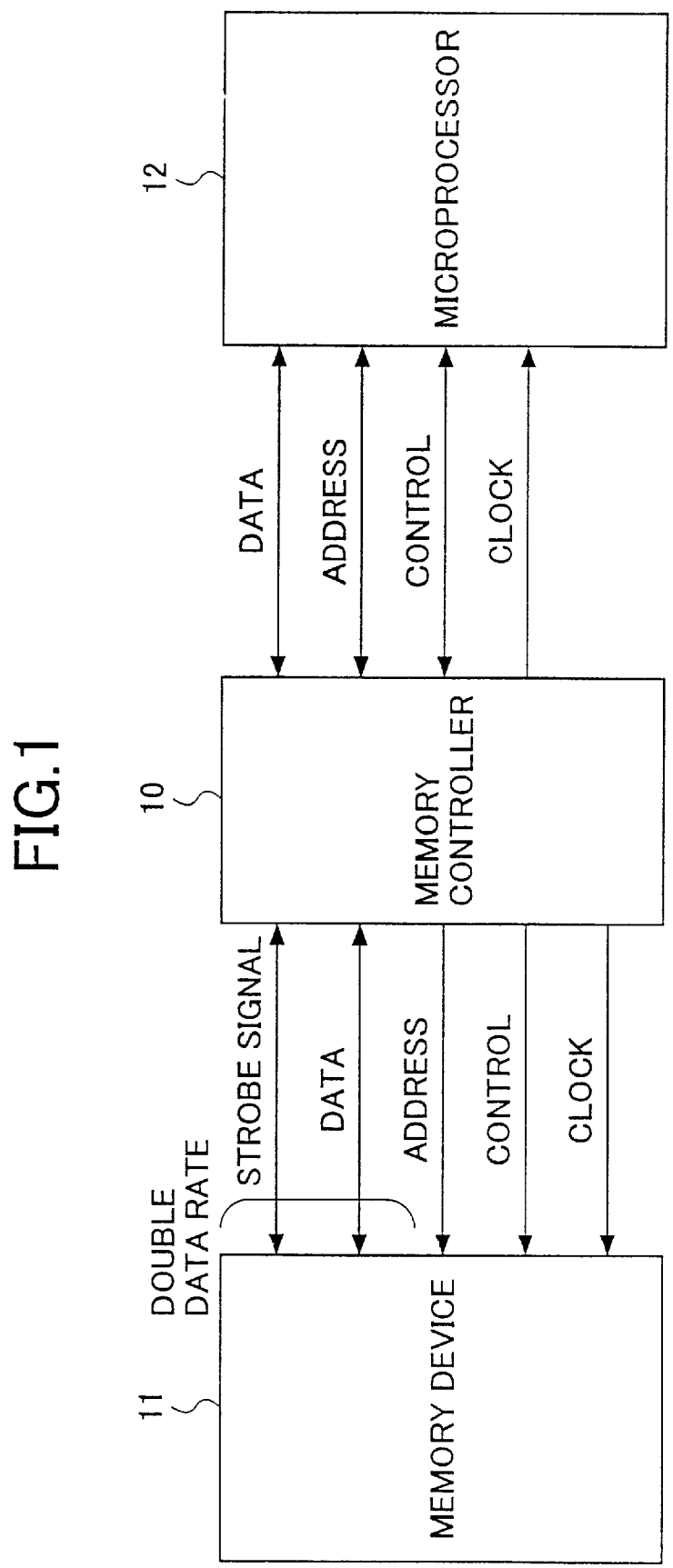
FIG. 1 is a block diagram of a system to which the present invention is applied.

FIG. 1 is a block diagram of a system to which the present invention is applied.

The system of FIG. 1 includes a memory controller 10, a memory device 11, and a microprocessor 12. The memory controller 10 acts as an intermediary for control between the microprocessor 12 and the memory device 11 when data read operations and data write operations are performed with respect to the memory device 11. The microprocessor 12 and the memory controller 10 exchange data signals, address signals, control signals, and a clock signal. The memory controller 10 and the memory device 11 exchange strobe signals, data signals, address signals, control signals, and a clock signal.

In general, the memory controller 10 serves to attend to various control operations relating to memory access such as converting bus widths of data buses between the microprocessor 12 and the memory device 11, carrying out DMA (direct memory access) operations with respect to the memory device 11, etc.

In the system to which the present invention is applied, the memory device 11 operates at a double data rate, and performs the outputting and inputting of data at rising edges and falling edges of a strobe signal. At the time of data write operations, the memory controller 10 supplies data and a strobe signal to the memory device 11, and, at the time of data read operations, the memory device 11 supplies data and a strobe signal to the memory controller 10. The strobe signal has the rising edges and falling edges thereof aligned to the timing of data changes of the data signals.

Figure 2:
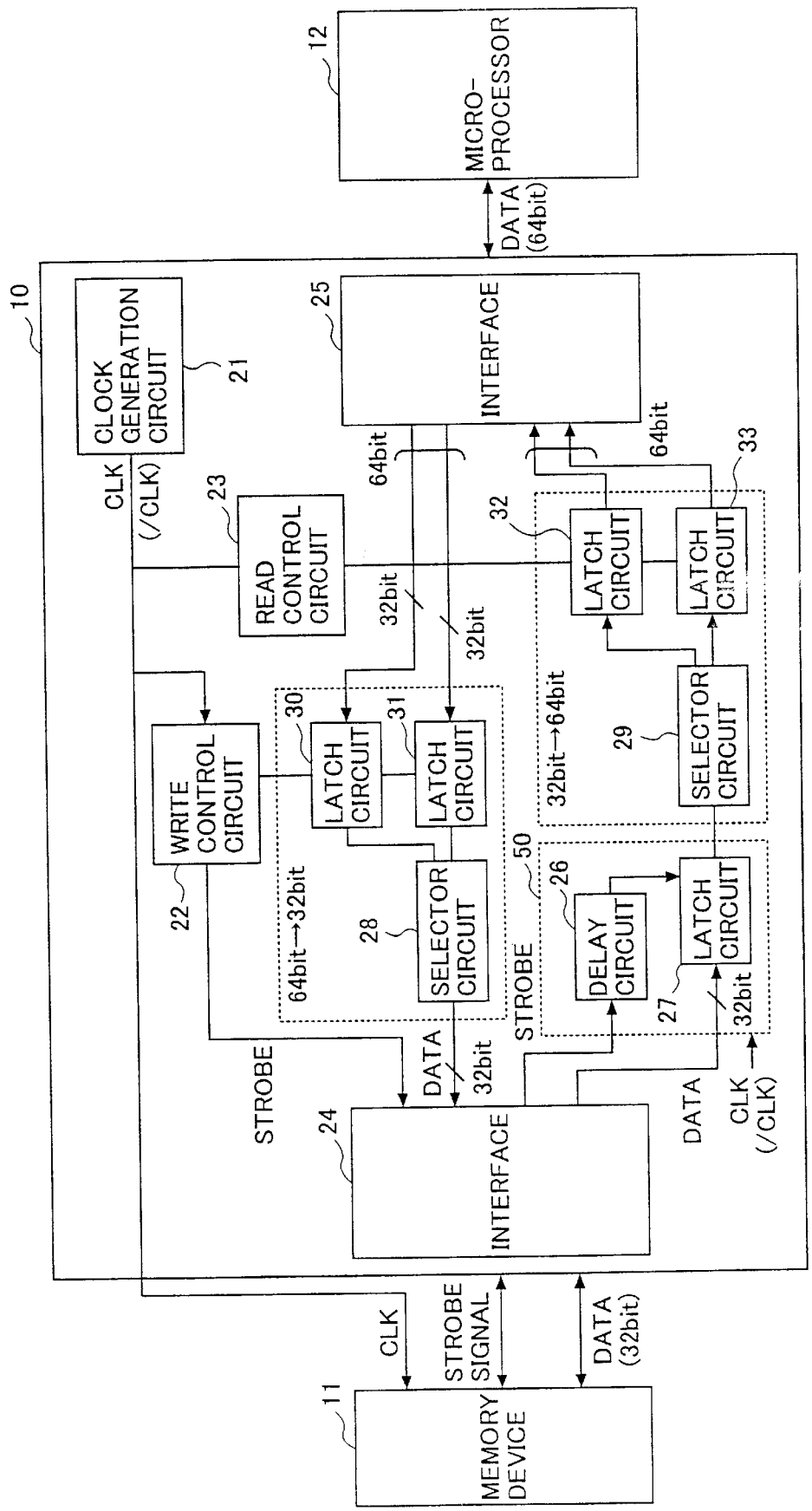
FIG. 2 is a block diagram of an example of a memory controller according to the present invention.

FIG. 2 is a block diagram of an example of the memory controller according to the present invention.

The memory controller 10 shown in FIG. 2 is an example of a memory controller of a particular type that converts data bus widths between the microprocessor 12 and the memory device 11 when the data bus width of the microprocessor 12 is 64 bits and the data bus width of the memory device 11 is 32 bits.

The memory controller 10 of FIG. 2 includes a clock generation circuit 21, a write control circuit 22, a read control circuit 23, an interface 24, an interface 25, a delay circuit 26, a latch circuit 27, a selector circuit 28, a selector circuit 29, and latch circuits 30 through 33.

The clock generation circuit 21 generates a clock signal CLK, and supplies it to the write control circuit 22 and the read control circuit 23. The clock generation circuit 21 further supplies the clock signal CLK to the memory device 11 connected to the memory controller 10. In the case of a memory device of a double data rate, a general configuration is such that a clock signal /CLK inverting the clock signal CLK is supplied in addition to the clock signal CLK. In some cases, the clock generation circuit 21 may generate a clock signal CLK2 having a frequency double the frequency of the clock signal CLK together with a clock signal /CLK2 that is an inverse thereof.

At the time of data write operations, 64-bit data supplied from the microprocessor 12 is stored in the latch circuits 30 and 31 via the interface 25, each storing a corresponding 32 bit half. The selector circuit 28 selects one of the latch circuits 30 and 31 alternately, and supplies the 32 bit data of the selected latch circuit to the memory device 11 via the interface 24. Operation timing of these operations is controlled by the write control circuit 22. Further, the write control circuit 22 supplies a data strobe signal to the memory device 11 via the interface 24.

At the time of data read operation, 32-bit data read from the memory device 11 is supplied to the latch circuit 27 via the interface 24. Further, a strobe signal form the memory device 11 is supplied to the delay circuit 26 via the interface 24. The delay circuit 26 delays the strobe signal by a ¼ cycle of the clock signal CLK, and supplies the delayed signal to the latch circuit 27 as a timing signal. The latch circuit 27 latches the data signals in response to the supplied timing signal. The selector circuit 29 selects one of the latch circuits 32 and 33 alternately, and supplies the data latched by the latch circuit 27 to the alternately selected latch circuit. A total of 64 bits of data collectively stored in the latch circuits 32 and 33 are supplied to the microprocessor 12 via the interface 25.

The delay circuit 26 and the latch circuit 27 together form a data acquisition circuit 50 of the present invention that acquires data signals by delaying the strobe signal by a ¼ cycle of the clock signal CLK. The data acquisition circuit 50 receives the clock signal CLK from the clock generation circuit 21.

Figure 3:
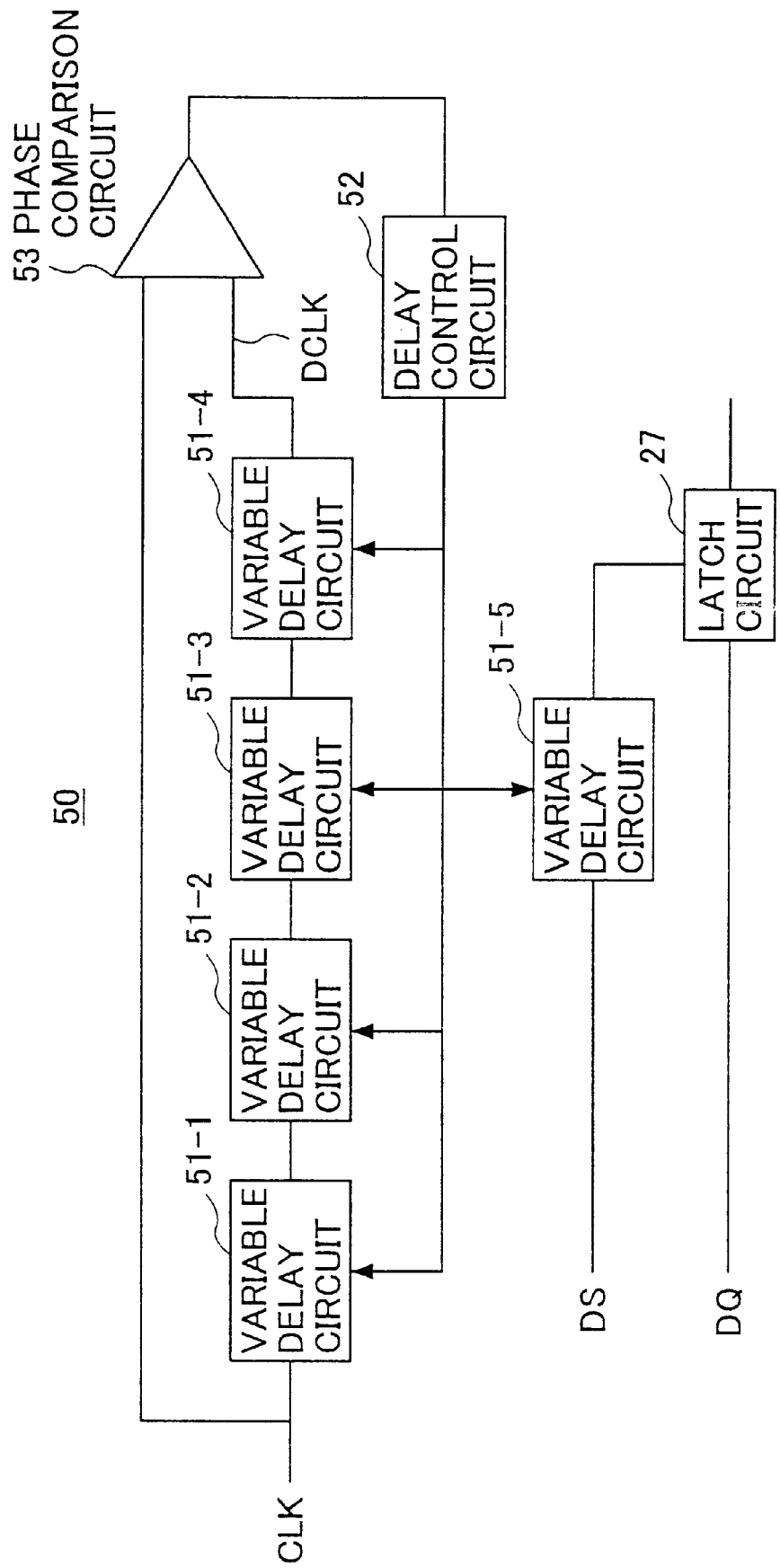
FIG. 3 is a block diagram of a first embodiment of a data acquisition circuit according to the present invention.

FIG. 3 is a block diagram of a first embodiment of the data acquisition circuit 50 according to the present invention.

The data acquisition circuit 50 includes five variable delay circuits 51-1 through 51-5, a delay control circuit 52, a phase comparison circuit 53, and the latch circuit 27. The variable delay circuits 51-1 through 51-5 have an identical circuit configuration, and are controlled by common control signals supplied from the delay control circuit 52. As a result, the variable delay circuits 51-1 through 51-5 always have the same delay. In FIG. 2, the delay circuit 26 collectively represents the variable delay circuits 51-1 through 51-5, the delay control circuit 52, and the phase comparison circuit 53 for the sake of clearness of the figure.

The clock signal CLK is input to one input node of the phase comparison circuit 53, and is delayed by the four variable delay circuits 51-1 through 51-4 before being input to the other input node of the phase comparison circuit 53 as a delayed clock signal DCLK. The phase comparison circuit 53 compares phases between the clock signal CLK and the delayed clock signal DCLK, and supplies results of the phase comparison to the delay control circuit 52.

The delay control circuit 52 generates control signals for the adjustment of delays of the four variable delay circuits 51-1 through 51-4 such that the phases of the clock signal CLK and the delayed clock signal DCLK become identical (to be exact, the delayed clock signal DCLK has a phase delayed by 360 degrees). Namely, edge timings are compared between the clock signal CLK and the delayed clock signal DCLK, and the delay is controlled to be increased when the delayed clock signal DCLK has edge timings that are relatively advanced, and is controlled to be decreased when the delayed clock signal DCLK has edge timings that are relatively delayed.

As a result of the delay adjustment as describe above, the delayed clock signal DCLK is controlled to have a 360-degree delay relative to the clock signal CLK. Since the variable delay circuits 51-1 through 51-4 have an identical circuit configuration and an identical delay, a single variable delay circuit has a delay of a ¼ cycle of the clock signal CLK when the delayed clock signal DCLK is delayed by 360 degrees behind the clock signal CLK.

Figure 4:
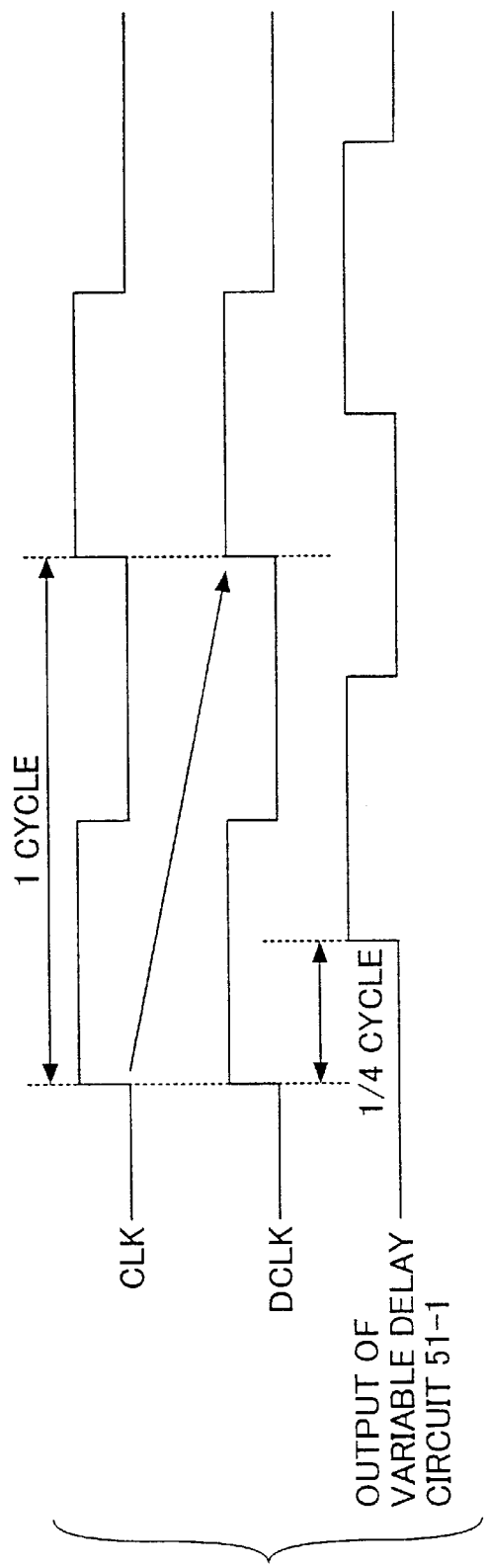
FIG. 4 is a timing chart showing relationships between a clock signal CLK, a delayed clock signal DCLK, and the output of a variable delay circuit.

FIG. 4 is a timing chart showing relationships between the clock signal CLK, the delayed clock signal DCLK, and the output of the variable delay circuit 51-1.

As shown in FIG. 4, the delayed clock signal DCLK is adjusted to be in a 360-degree delay relative to the clock signal CLK. In this case, the four variable delay circuits 51-1 through 51-4 have the daly thereof equal to one cycle of the clock signal CLK, so that the output of the variable delay circuit 51-1 will be delayed from the clock signal CLK by a ¼ cycle of the clock signal CLK. Namely, the delay of the variable delay circuit 51-1 is set equal to the ¼ cycle of the clock signal CLK.

In FIG. 3, the variable delay circuit 51-5 is controlled by the same control signals as the other variable delay circuits so as to have a delay identical to that of other variable delay circuits. The variable delay circuit 51-5 thus has a delay equal to a ¼ cycle of the clock signal CLK. A data strobe signal DS that is input to the variable delay circuit 51-5 is delayed by the ¼ cycle of the clock signal CLK, followed by being supplied to the latch circuit 27 as a timing signal. The latch circuit 27 latches data signals DQ in response to the supplied timing signal.

The timing signal supplied to the latch circuit 27 is obtained by delaying the data strobe signal DS by a ¼ cycle of the clock signal CLK. Timing of data changes in the data signals DQ corresponds to rising edges and falling edges of the data strobe signal DS. The timing signal supplied to the latch circuit 27 triggers the latching of the data signals DQ at an exact midpoint between data changes of the data signals DQ. This insures an optimum data-hold time and an optimum data-setup time.

Even when the delay of the variable delay circuits varies due to a variety of variation factors such as variation of the manufacturing process, variation in ambient temperature, and variation in the power supply voltage, proper delay control based on the phase comparison of clock signals makes it possible to adjust the delay of the variable delay circuit 51-5 to be equal to the ¼ cycle of the clock signal. Under the conditions in which a variety of variation factors are present, therefore, optimum data acquisition timing can be achieved.

Figure 5:
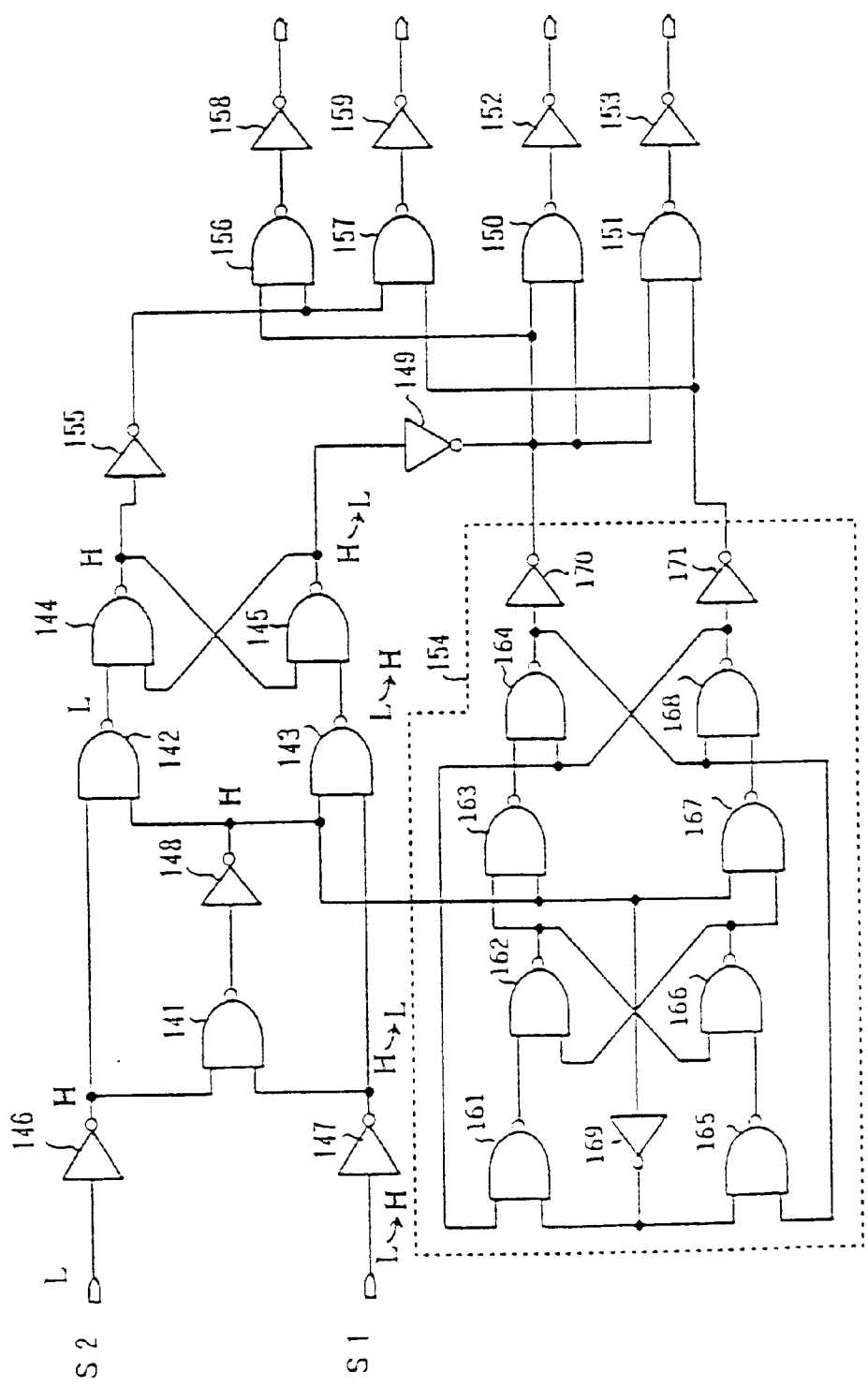
FIG. 5 is a circuit diagram showing an example of a circuit configuration of a delay control circuit and a phase comparison circuit.

FIG. 5 is a circuit diagram showing an example of a circuit configuration of the delay control circuit 52 and the phase comparison circuit 53. Signals S1 and S2 input to the circuit of FIG. 5 correspond to the clock signal CLK and the delayed clock signal DCLK, respectively.

The circuit of FIG. 5 includes NAND circuits 141 through 145, inverters 146 through 149, NAND circuits 150 and 151, inverters 152 and 153, a binary counter 154, an inverter 155, NAND circuits 156 and 157, and inverters 158 and 159. The NAND circuits 141 through 145 and the inverters 146 through 149 together form the phase comparison circuit 53, and the rest of the circuit constitutes the delay control circuit 52, for example.

The NAND circuits 144 and 145 together form a latch. This latch has two LOW inputs and two HIGH outputs in an initial condition as shown in FIG. 5. When a rising edge of the signal S1 is ahead of a rising edge of the signal S2, the output of the NAND circuit 143 becomes HIGH ahead of the output of the NAND circuit 142. The output of the NAND circuit 145 thus becomes LOW, while the NAND circuit 144 keeps the HIGH output thereof. This condition is latched by the latch, and, thus, does not change even when the output of the NAND circuit 142 is turned to HIGH by the rising edge of the signal S2. As a result, an output of the inverter 149 is HIGH when the signal S1 has a phase which is ahead in time. Conversely, when the phase of the signal S2 is ahead in time, an output of the inverter 155 becomes HIGH.

A signal from the inverter 148 serves to bring the latch to the initial condition at an appropriate timing by simultaneously turning the outputs of the NAND circuits 142 and 143 to LOW. If this configuration was not in place, the outputs of the NAND circuits 143 and 142 would become HIGH successively in this order when the phase of the signal S1 was ahead in time, and, then, the condition of the latch would be reversed when the signal S1 became LOW ahead of the signal S2, thereby providing a LOW output from the NAND circuit 144. In order to avoid this, the outputs of the NAND circuits 142 and 143 are changed to LOW at the same time.

The output of the inverter 148 is also provided to the binary counter 154. The binary counter 154 has two outputs which become HIGH in turn at every cycle of the input signals S1 and S2 The binary counter 154 includes NAND circuits 161 through 168 and inverters 169 through 171. Operations of the binary counter 154 are well within the scope of ordinary skill in the art, and a description thereof will be omitted.

The two outputs of the binary counter 154 are supplied to one of the two inputs of the NAND circuits 150 and 151, respectively. The other input of the NAND circuits 150 and 151 receives the output of the inverter 149. Further, the two outputs of the binary counter 154 are supplied to one of the two inputs of the NAND circuits 156 and 157, respectively. The other input of the NAND circuits 156 and 157 receives the output of the inverter 155.

Accordingly, when the signal S1 has a phase ahead of the phase of the signal S2, the inverters 152 and 153, which invert outputs of the NAND circuits 150 and 151, respectively, provide HIGH pulses in turn. On the other hand, when the phase of the signal S2 is ahead in time, the inverters 158 and 159, which invert outputs of the NAND circuits 156 and 157, respectively, provide HIGH pulses in turn.

The HIGH pulses output from the inverters 152 and 153 or the inverters 158 and 159 in turn are supplied to the variable delay circuits, thereby adjusting the delays of the variable delay circuits.

Figure 6:
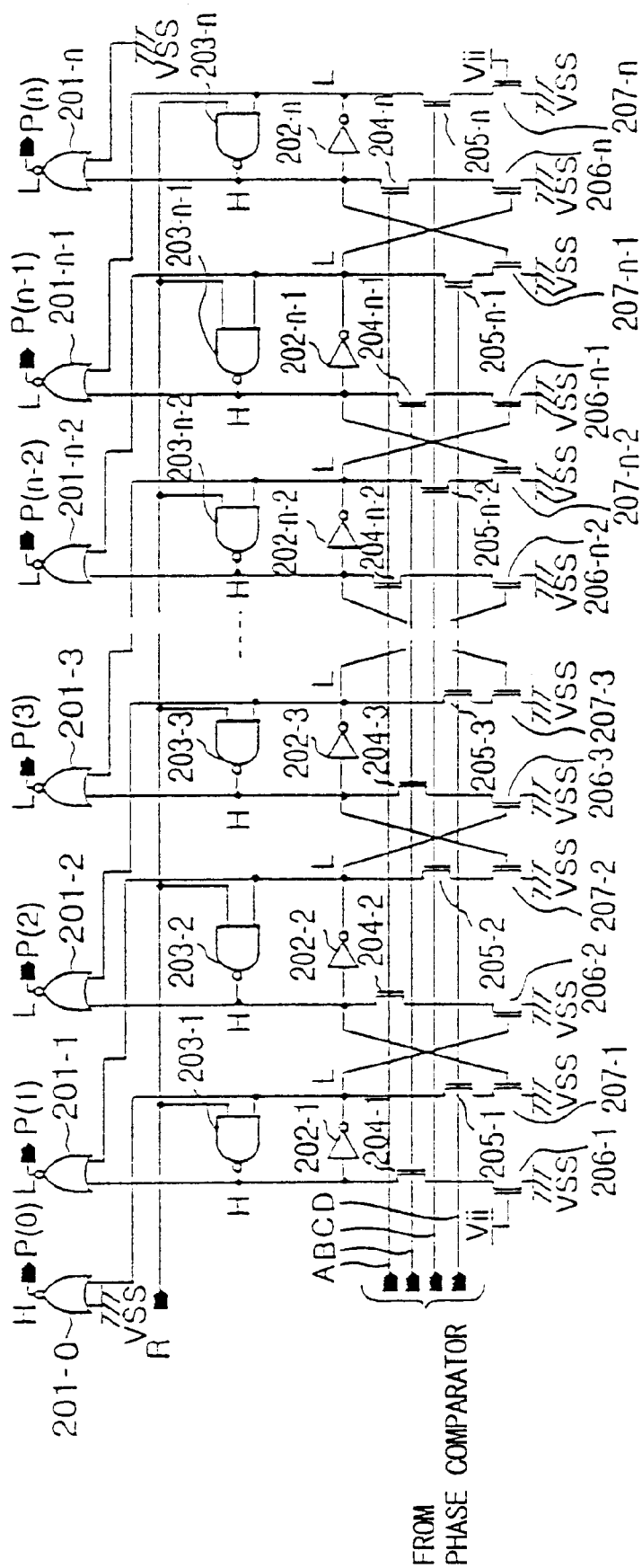
FIG. 6 is a circuit diagram showing a portion of the variable delay circuit.
Figure 7:
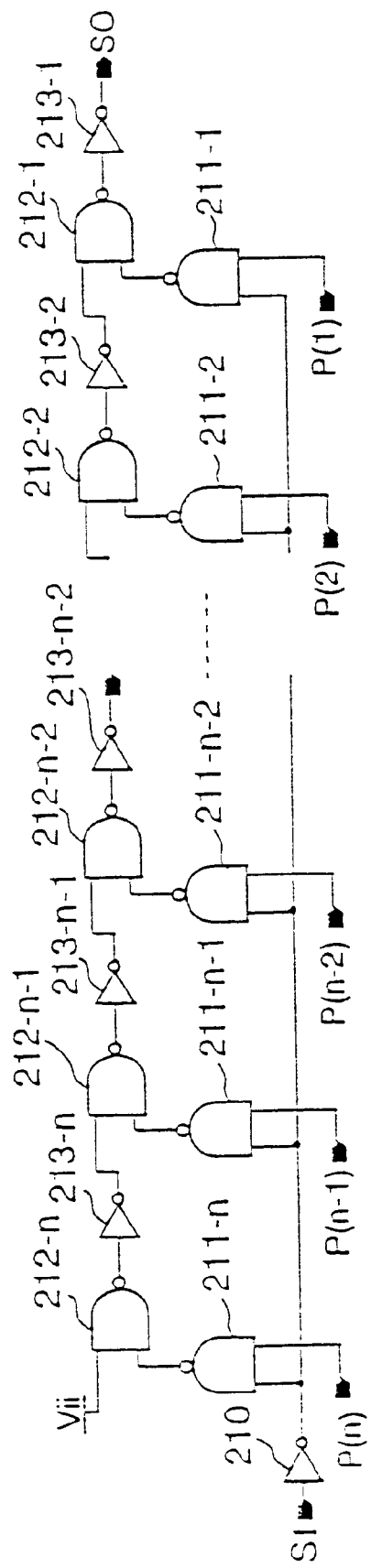
FIG. 7 is a circuit diagram showing the remaining portion of the variable delay circuit.

FIG. 6 is a circuit diagram showing a portion of a variable delay circuit. FIG. 7 is a circuit diagram showing the remaining portion of the variable delay circuit. The circuit configurations of FIG. 6 and FIG. 7 together constitute the entirety of the variable delay circuit.

The delay-control circuit 135 includes NOR circuits 201-0 through 201-n, inverters 202-1 through 202-n, NAND circuits 203-1 through 203-n, NMOS transistors 204-1 through 204-n, NMOS transistors 205-1 through 205-n, NMOS transistors 206-1 through 206-n, and NMOS transistors 207-1 through 207-n. When a reset signal R is turned to LOW, the circuit of FIG. 6 is reset. Namely, when the reset signal R becomes LOW, outputs of the NAND circuits 203-1 through 203-n become HIGH, and outputs of the inverters 202-1 through 202-n become LOW. A pair of a given one of the NAND circuits 203-1 through 203-n and a corresponding one of the inverters 202-1 through 202-n forms a latch in which one element of the pair receives an output of the other element as an input. An initial state created by the reset signal R is thus kept even after the reset signal R returns to HIGH.

In this initial state, an output P(0) of the NOR circuit 201-0 is HIGH as shown in FIG. 6, and the remaining NOR circuits 201-1 through 201-n have outputs P(1) through P(n), respectively, which are LOW. That is, only the output P(0) is HIGH among the outputs P(0) through P(n)

When there is a need to increase the amount of delay, HIGH pulses are supplied to signal lines A and B in turn. With a HIGH pulse supplied to the signal line B, the NMOS transistor 204-1 is turned on. Since the NMOS transistor 206-1 is in a turned-on state, an output of the NAND circuit 203-1 is connected to the ground, and is forced to change from HIGH to LOW, so that an output of the inverter 202-1 becomes HIGH. This condition is latched by the latch comprising the NAND circuit 203-1 and the inverter 202-1. As a result, the output P(0) is changed from HIGH to LOW, while the output P(1) is turned from LOW to HIGH. In this condition, therefore, only the output P(1) is HIGH.

With a HIGH pulse supplied to the signal line A, the NMOS transistor 204-2 is turned on. Since the NMOS transistor 206-2 is already in a turned-on state, an output of the NAND circuit 203-2 is connected to the ground, and is forced to change from HIGH to LOW, so that an output of the inverter 202-2 becomes HIGH. This condition is latched by the latch comprising the NAND circuit 203-2 and the inverter 202-2. As a result, the output P(1) is changed from HIGH to LOW, while the output P(2) is turned from LOW to HIGH. In this condition, therefore, only the output P(2) is HIGH.

As described above, HIGH pulses are supplied in turn to the signal lines A and B to shift the only one HIGH output among the outputs P(0) through P(n) to the right.

When there is a need to decrease the delay amount, HIGH pulses are supplied to signal lines C and D in turn. Operations in this case are simply a reverse of the above-described operations, and a description thereof will be omitted. When HIGH pulses are supplied to the signal lines C and D in turn, the only one HIGH output among the outputs P(0) through P(n) will be shifted one by one to the left.

The output signals P(1) through P(n) are supplied to the circuit portion of the variable delay circuit shown in FIG. 7 so as to adjust a signal delay.

The circuit portion of the variable delay circuit shown in FIG. 7 includes an inverter 210, NAND circuits 211-1 through 211-n, NAND circuits 212-1 through 212-n, and inverters 213-1 through 213-n. The NAND circuits 212-1 through 212-n and the inverters 213-1 through 213-n together form a delay line.

The NAND circuits 211-1 through 211-n have one input for receiving an inverse of an input signal S1 from the inverter 210, and have the other input which is provided with the signals P(1) through P(n), respectively. The only one HIGH signal among the signals P(1) through P(n) is denoted as P(x).

The NAND circuits 211-1 through 211-n, except for the NAND circuit 211-x, have one input which is LOW, and, thus, have a HIGH output. The NAND circuits 212-1 through 212-n, except for the NAND circuit 212-x, receive this HIGH output at one input thereof, thereby serving as an inverter to the other input thereof.

Accordingly, a portion of the delay line which is situated upstream from the NAND circuit 212-x allows a fixed HIGH level to propagate therethrough when this fixed HIGH level is supplied to one input of the NAND circuit 212-n. The NAND circuit 212-x thus receives the fixed HIGH level at one input thereof. The other input of the NAND circuit 212-x receives the input signal S1 via the inverter 210 and the NAND circuit 211-x. Another portion of the delay line from the NAND circuit 212-x to the inverter 213-1 allows the input signal S1 to propagate therethrough with some delays, thereby generating a delayed signal as an output signal SO. The output signal SO in this case is delayed by a delay amount commensurate with x stages of delay elements in comparison with the input signal S1.

As described above, the phase comparison circuit 53 and the delay control circuit 52 of FIG. 5 compare phases of the clock signals, and outputs the pulse signals that alternately become HIGH based on the phase comparison. These pulse signals are supplied to the circuit portion of the variable delay circuit shown in FIG. 6, thereby controlling the position of the only one HIGH signal among the output signals P(1) through P(n). The signals P(1) through P(n) set a delay to the circuit portion of the variable delay circuit shown in FIG. 7.

Figure 8:
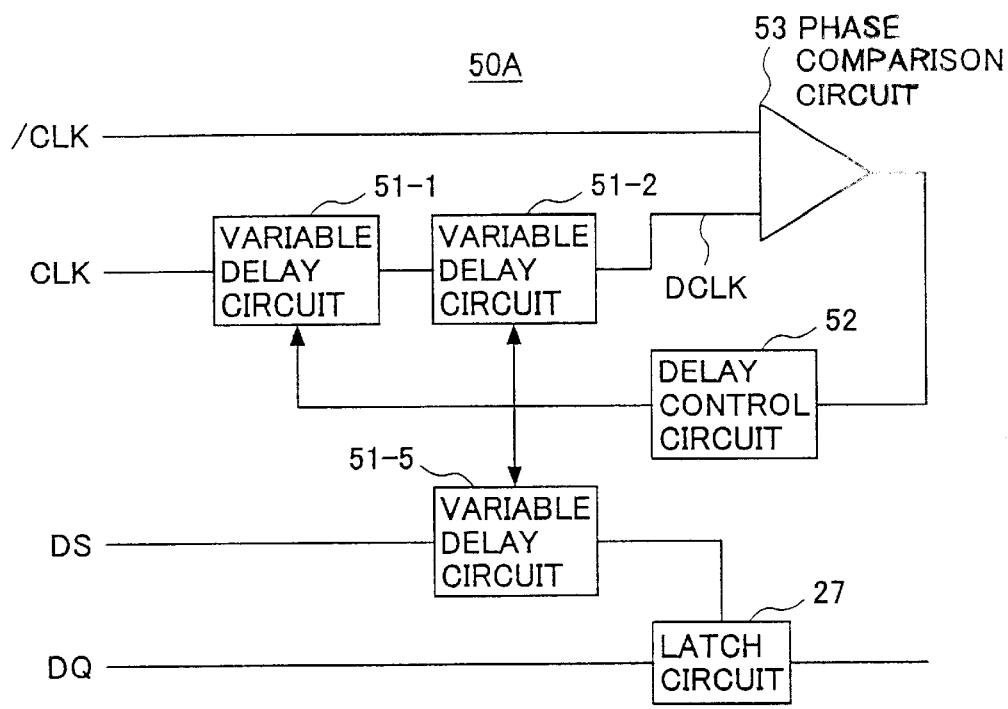
FIG. 8 is a block diagram showing a second embodiment of the data acquisition circuit according to the present invention.

FIG. 8 is a block diagram showing a second embodiment of the data acquisition circuit according to the present invention.

A data acquisition circuit 50A includes the three variable delay circuits 51-1, 51-2 and 51-5, the delay control circuit 52, the phase comparison circuit 53, and the latch circuit 27.

An inverted clock signal /CLK, which is an inverse of the clock signal CLK, is supplied to one input of the phase comparison circuit 53, and the other input of the phase comparison circuit 53 receives the delayed clock signal DCLK that is the clock signal CLK delayed by the two variable delay circuits 51-1 and 51-2. The phase comparison circuit 53 compares phases between the inverted clock signal /CLK and the delayed clock signal DCLK, and supplies results of the phase comparison to the delay control circuit 52.

The delay control circuit 52 generates control signals for the adjustment of delays of the two variable delay circuits 51-1 and 51-2 such that the phases of the inverted clock signal /CLK and the delayed clock signal DCLK become identical. Namely, edge timings are compared between the inverted clock signal /CLK and the delayed clock signal DCLK, and the delay is controlled to be increased when the delayed clock signal DCLK has edge timings that are relatively advanced, and is controlled to be decreased when the delayed clock signal DCLK has edge timings that are relatively delayed.

As a result of the delay adjustment as describe above, the delayed clock signal DCLK is controlled to have the same phase as the inverted clock signal /CLK. That is, the delayed clock signal DCLK is controlled to be placed in a 180-degree phase delay relative to the clock signal CLK. Since the variable delay circuits 51-1 and 51-2 have an identical circuit configuration and an identical delay, a single variable delay circuit has a delay of a ¼ cycle of the clock signal CLK when the delayed clock signal DCLK is delayed by 180 degrees from the clock signal CLK.

The variable delay circuit 51-5 is controlled by the same control signals as the other variable delay circuits so as to have a delay identical to that of other variable delay circuits. The variable delay circuit 51-5 thus has a delay equal to a ¼ cycle of the clock signal CLK. A data strobe signal DS that is input to the variable delay circuit 51-5 is delayed by the ¼ cycle of the clock signal CLK, followed by being supplied to the latch circuit 27 as a timing signal. The latch circuit 27 latches data signals DQ in response to the supplied timing signal.

Accordingly, even in the presence of a variety of variation factors such as variation of the manufacturing process, variation in ambient temperature, and variation in the power supply voltage, optimum data acquisition timing can be achieved. Further, the number of variable delay circuits is reduced to achieve a circuit size reduction, thereby lowering the cost.

Figure 9:
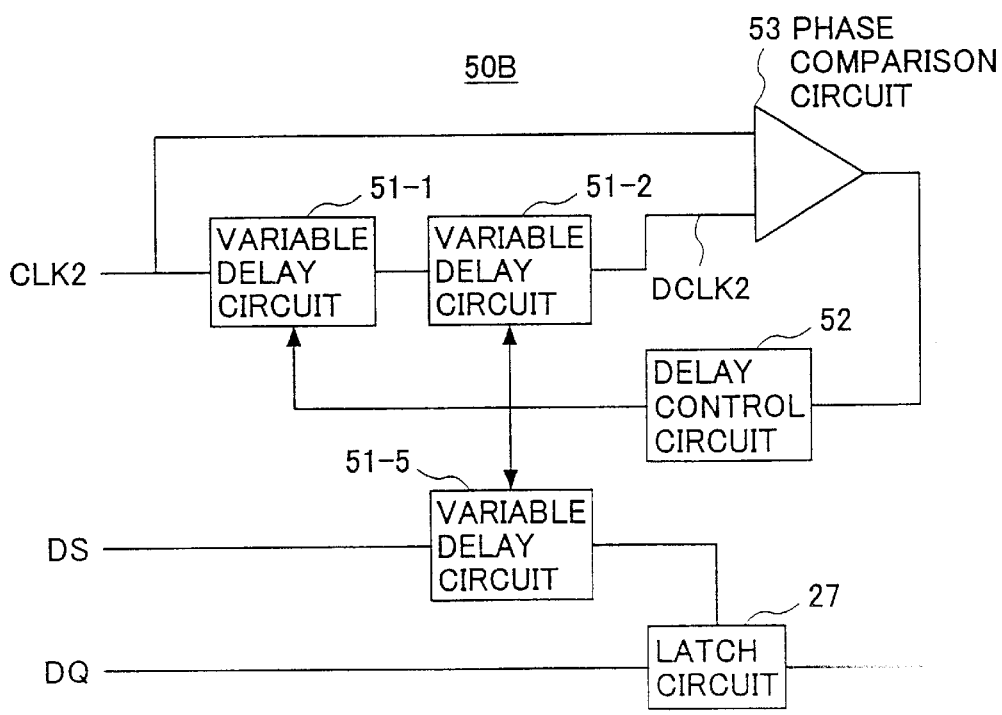
FIG. 9 is a block diagram showing a third embodiment of the data acquisition circuit according to the present invention.

FIG. 9 is a block diagram showing a third embodiment of the data acquisition circuit according to the present invention.

A data acquisition circuit 50B includes the three variable delay circuits 51-1, 51-2 and 51-5, the delay control circuit 52, the phase comparison circuit 53, and the latch circuit 27.

A clock signal CLK2, which has double the frequency of the clock signal CLK, is generated by the clock generation circuit 21 (see FIG. 2), and is supplied to one input of the phase comparison circuit 53. The other input of the phase comparison circuit 53 receives a delayed clock signal DCLK2 that is the clock signal CLK2 delayed by the two variable delay circuits 51-1 and 51-2. The phase comparison circuit 53 compares phases between the clock signal CLK2 and the delayed clock signal DCLK2, and supplies results of the phase comparison to the delay control circuit 52.

The delay control circuit 52 generates control signals for the adjustment of delays of the two variable delay circuits 51-1 and 51-2 such that the phases of the clock signal CLK2 and the delayed clock signal DCLK2 become identical (to be exact, the delayed clock signal DCLK2 has a phase delayed by 360 degrees). As a result of this delay adjustment, the delayed clock signal DCLK2 is controlled to have a 360-degree phase delay relative to the clock signal CLK. Since the variable delay circuits 51-1 and 51-2 have an identical circuit configuration and an identical delay, a single variable delay circuit has a delay of a ½ cycle of the clock signal CLK2 when the delayed clock signal DCLK2 is delayed by 360 degrees from the clock signal CLK2. When the cycle of the clock signal CLK that is double the cycle of the clock signal CLK2 is taken into consideration, a single variable delay circuit ends up having a ¼ cycle delay.

The variable delay circuit 51-5 thus has a delay equal to a ¼ cycle of the clock signal CLK. The latch circuit 27 latches data signals DQ in response to a timing signal that is delayed by a ¼ cycle.

Accordingly, even in the presence of a variety of variation factors such as variation of the manufacturing process, variation in ambient temperature, and variation in the power supply voltage, optimum data acquisition timing can be achieved. Further, the number of variable delay circuits is reduced to achieve a circuit size reduction, thereby lowering the cost.

Figure 10:
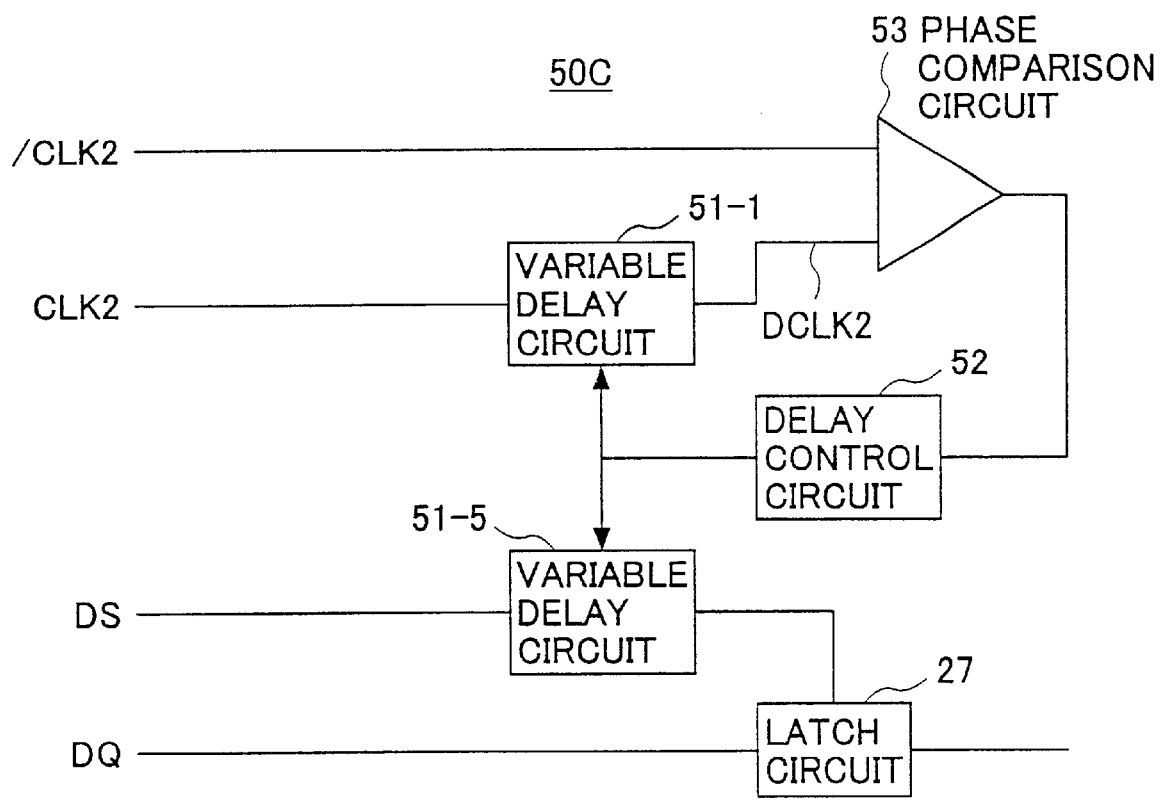
FIG. 10 is a block diagram showing a fourth embodiment of the data acquisition circuit according to the present invention.

FIG. 10 is a block diagram showing a fourth embodiment of the data acquisition circuit according to the present invention.

A data acquisition circuit 50C of FIG. 10 includes the two variable delay circuits 51-1 and 51-2, the delay control circuit 52, the phase comparison circuit 53, and the latch circuit 27.

A clock signal CLK2, which has double the frequency of the clock signal CLK, is generated by the clock generation circuit 21 (see FIG. 2), and an inverted clock signal /CLK2 that is an inverse thereof is also generated by the clock generation circuit 21. The inverted clock signal /CLK2 is supplied to one input of the phase comparison circuit 53. The other input of the phase comparison circuit 53 receives a delayed clock signal DCLK2 that is the clock signal CLK2 delayed by the variable delay circuit 51-1. The phase comparison circuit 53 compares phases between the inverted clock signal /CLK2 and the delayed clock signal DCLK2, and supplies results of the phase comparison to the delay control circuit 52.

The delay control circuit 52 generates control signals for the adjustment of a delay of the variable delay circuit 51-1 such that the phases of the inverted clock signal /CLK2 and the delayed clock signal DCLK2 become identical. As a result of this delay adjustment, the delayed clock signal DCLK2 is controlled to have a 180-degree phase delay relative to the clock signal CLK2. The variable delay circuit 51-1 thus has a delay of a ½ cycle of the clock signal CLK2. When the cycle of the clock signal CLK that is double the cycle of the clock signal CLK2 is taken into consideration, the variable delay circuit 51-1 ends up having a ¼ cycle delay.

As a result, the variable delay circuit 51-5 has a delay equal to a ¼ cycle of the clock signal CLK. The latch circuit 27 latches data signals DQ in response to a timing signal that is delayed by a ¼ cycle.

Accordingly, even in the presence of a variety of variation factors such as variation of the manufacturing process, variation in ambient temperature, and variation in the power supply voltage, optimum data acquisition timing can be achieved. Further, the number of variable delay circuits is reduced to achieve a circuit size reduction, thereby lowering the cost.

Figure 11:
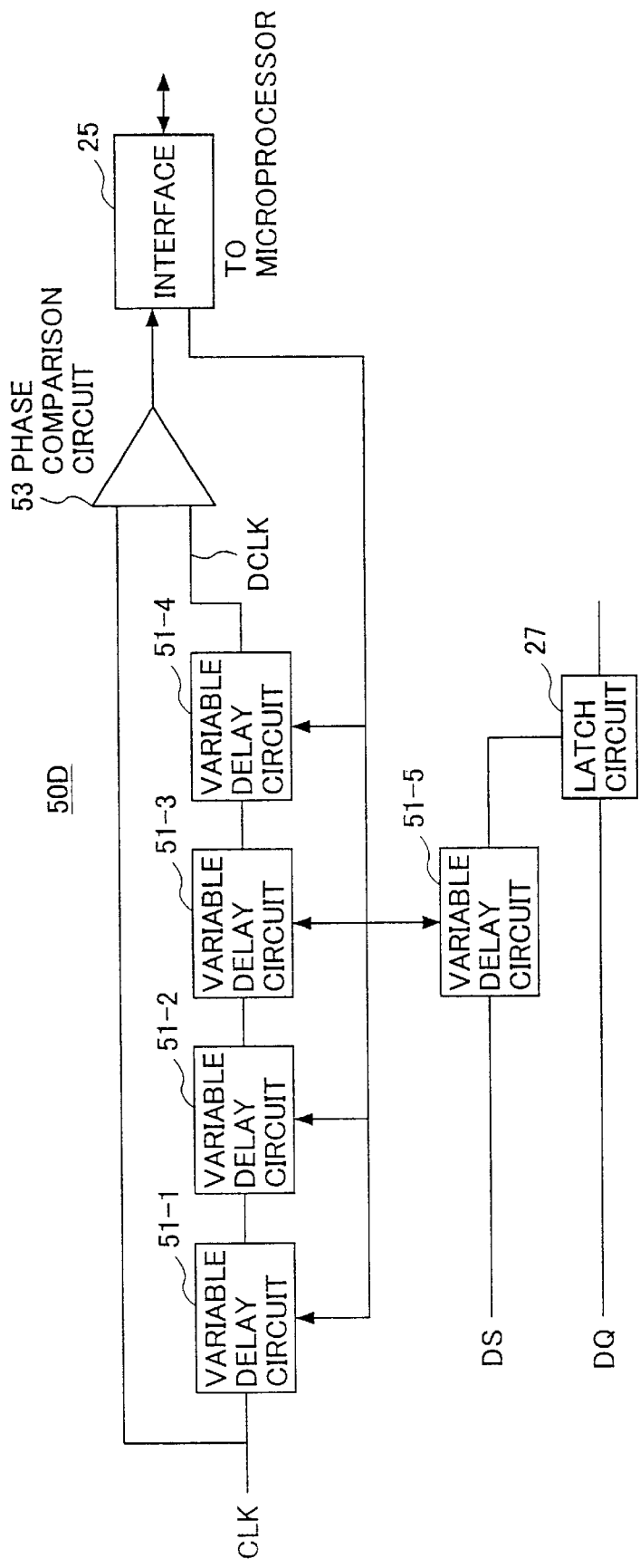
FIG. 11 is a block diagram showing a fifth embodiment of the data acquisition circuit according to the present invention.

FIG. 11 is a block diagram showing a fifth embodiment of the data acquisition circuit according to the present invention. In FIG. 11, the same elements as those of FIG. 3 are referred to by the same reference numerals, and a description thereof will be omitted.

A data acquisition circuit 50D does not have the delay control circuit 52 compared to the data acquisition circuit 50 of FIG. 3. Further, the data acquisition circuit 50D is connected to the microprocessor 12 via the interface 25 (see FIG. 2).

The phase comparison circuit 53 of the data acquisition circuit 50D sends the determination of phase comparison to the microprocessor 12. In response, the microprocessor 12 supplies control signals so as to control the delay of the variable delay circuits 51-1 through 51-5 of the data acquisition circuit 50D. In detail, the output of the inverter 149 in the phase comparison circuit 53 of FIG. 5 may be supplied to the microprocessor 12 via the interface 25 since this output can serve as a signal indicative of which one of the input signals S1 and S2 has a rising edge more advanced than the other. The microprocessor 12 may supply, as control signals, the pulse signals of FIG. 6 that become HIGH alternately to be supplied to either the signal lines A and B or the signal lines C and D depending on whether the delay should be increased or decreased in the variable delay circuit of FIG. 6.

In this manner, the phase comparison circuit 53 sends the determination of phase comparison (the results of phase comparison) to the microprocessor 12, and the microprocessor 12 provides the variable delay circuits with control signals for the delay adjustment of variable delay circuits, thereby eliminating a need for circuitry dedicated for delay control purposes. This makes it possible to reduce a circuit size. Since the delay can be adjusted through software control based on programs executed by the microprocessor 12 rather than through hardwired control, it is easier to cope with changes in settings and configurations.

The above-described configuration, in which the phase comparison circuit 53 sends the determination of phase comparison to the microprocessor, and the control signals for delay adjustment are sent from the microprocessor to the variable delay circuits, is applicable to the second through fourth embodiments of the data acquisition circuit shown in FIG. 8 through FIG. 10. Further, it is not necessarily the microprocessor 12, but can be another microprocessor, a control processor of the similar type, or the like that receives the determination of phase control and supplies control signals for delay control.

Moreover, in the description of the above embodiments, the memory controller 10 is of the type that converts data-bus width when the microprocessor 12 has a 64-bit data bus and the memory device 11 has a 32-bit data bus. The present invention is not limited to this particular configuration, but is applicable to various controllers having various control functions.

In the following, another aspect of the present invention will be described.

In general, a semiconductor integrated circuit receives signals from an exterior thereof, and carries out operations responsive to the input signals, followed by outputting output signals. It is thus important what timing the output signals are obtained relative to the timing of the input signals. In general-purpose LSIs, such timing is generally defined in the specification. In DRAMs (dynamic random access memories), for example, various requirements are defined with respect to a maximum frequency of the address signals, timing of data outputs relative to the edges of address signals, a data-setup time for writing data, etc.

With increases in the CPU clock speed of computer systems and increases in processing speed of various electronic circuits in recent years, interface circuits also need to operate faster. Various synchronous memory devices have thus been developed, including SDRAMs (synchronous DRAMs), which offer a data-transfer speed exceeding 100 MHz. SDRAMs attend to data input/output operation in synchronization with a high-speed clock signal supplied from an external source. Internal operations are pipelined typically, with the operations of pipelines being performed in parallel, thereby achieving a fast operation speed. In order to increase the speed of data input/output without boosting the frequency of a clock signal, further, data is input and output in synchronization with both the falling edges and the rising edges of the clock signal. Such memory devices are called double-data-rate (DDR) memory devices. The following description is provided with respect to a DDR memory device, but this aspect of the present invention is not limited to DDR memory devices.

When data is read from or written to a memory device, a latch circuit is used to latch data. Such latching operation needs to be carried out when data is stable. In high-speed memory devices, an interval between successive data inputs/outputs is very short, so that the latch timing needs to be accurately defined relative to the data timing in order to latch the data that is stable. On the data output side, data is output in synchronization with a strobe signal, which is also output. The strobe signal is similar to clock signal in that it has a predetermined cycle, and is generally generated from a clock signal. On the data input side, the strobe signal is delayed to generate a latch signal, which is used to latch the data at an optimum timing.

Figure 12:
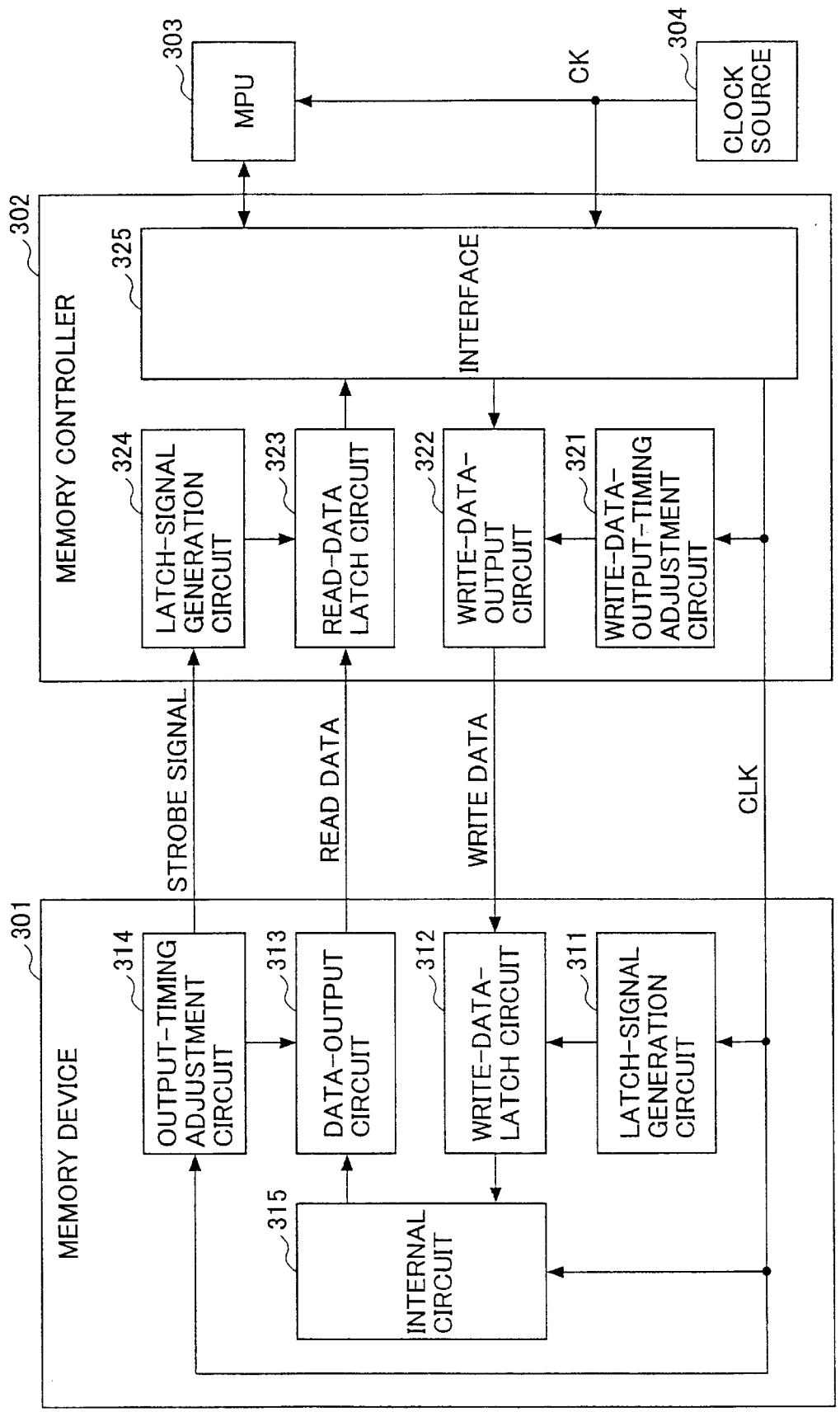
FIG. 12 is a block diagram of a memory system using s synchronous memory device.

FIG. 12 is a block diagram of a memory system using s synchronous memory device. As shown in FIG. 12, a microprocessor (MPU) 303 is connected to a synchronous memory device 301 via a memory controller 302. A clock source 304 supplies a system clock signal CK to the MPU 303, and also supplies the system clock signal CK to the memory controller 302.

An interface 325 of the memory controller 302 receives data to be written and address signals from the MPU 303, and supplies data read from the memory device to the MPU 303. Further, The interface 325 generates a clock signal CLK from the system clock signal CK, and supplies the clock signal CLK to a write-data-output-timing adjustment circuit 321. The clock signal CLK is also supplied from the memory controller 302 to the memory device 301. A write-data-output circuit 322 outputs the data to be written in synchronization with an output timing signal that is supplied from the write-data-output-timing adjustment circuit 321.

The write-data-output-timing adjustment circuit 321 adjusts the timing of the output timing signal such that the data to be written changes at the edge timing of the clock signal CLK, for example.

A latch-signal generation circuit 311 of the memory device 301 delays the clock signal CLK to generate a latch signal, which is supplied to a write-data-latch circuit 312. The write-data-output circuit 322 of the memory controller 302 changes the write data in synchronization with the edges of the clock signal CLK, so that the latch-signal generation circuit 311 generates the latch signal by delaying the clock signal CLK by half the cycle for an ordinary data rate configuration, and generates complementary latch signals by delaying the clock signal CLK by a ¼ cycle for a double data rate configuration. The write data latched by the write-data-latch circuit 312 is supplied to and stored in an internal circuit 315. In this example, the clock signal CLK serves as a strobe signal for the transmission of write data. Address signals and control signals are supplied from the memory controller 302 to the memory device 301 in the same manner. The memory controller 302 is thus provided with output circuits for outputting the address signals and control signals, and the memory device 301 is provided with input circuits for inputting these signals. For the sake of simplicity of explanation, these circuits are omitted from FIG. 12, and will be omitted in descriptions that follow.

When data is to be read from the memory device 301, proper address signals and control signals are supplied to the memory device 301, and the internal circuit 315 supplies the data to a data-output circuit 313. An output-timing adjustment circuit 314 delays the clock signal CLK to generate a strobe signal. The data-output circuit 313 outputs the data in synchronization with an output timing signal supplied from the output-timing adjustment circuit 314. The output-timing adjustment circuit 314 adjusts the timing of the output timing signal such that the output data changes in synchronization with the edges of the strobe signal, for example.

A latch-signal generation circuit 324 of the memory controller 302 delays the strobe signal to generate a latch signal, and supplies the latch signal to a read-data latch circuit 323. The read-data latch circuit 323 latches the read data in response to the latch signal. As described above, the data-output circuit 313 of the memory device 301 changes the output read data in synchronization with the edges of the strobe signal, so that the latch-signal generation circuit 324 generates the latch signal by delaying the strobe signal by half the cycle for the ordinary data rate configuration, and generates complementary latch signals by delaying the strobe signal by a ¼ cycle for the double data rate configuration. The read data latched by the read-data latch circuit 323 is supplied to the MPU 303 via the interface 325.

In the configuration of FIG. 12, the data to be written is output in synchronization with the clock signal. Since the crucial issues to be addressed for achieving high-speed memory devices are the issues of data read speed, and the data write operation can be actually carried out at slower speed, the data to be written may be output without any synchronization with a clock signal. Moreover, if the clock signal is regarded as a strobe signal, then, the data write operation and the data read operation are substantially the same in terms of the transmission and reception of data. In the following, only a description of transmission and reception of read data will be given without referring to transmission and reception of write data.

FIGS. 13A and 13B are time charts showing relationships between the read data, the strobe signal, and the latch signal.

FIG. 13A shows the case of the ordinary data rate, and FIG. 13B shows the case of the double data rate. As shown in figures, the strobe signal has a cycle identical to that of the clock signal. In the case of the ordinary data rate, as shown in FIG. 13A, read data DQ changes at the rising edges of the strobe signal. Accordingly, the latch signal may be preferably designed to have rising edges at midpoint between changes of the output data DQ, so that the latch-signal generation circuit 324 delays the strobe signal by half a cycle. In the case of the double data rate, as shown in FIG. 13B, the read data DQ changes at both the rising edges and the falling edges of the strobe signal. Accordingly, the latch-signal generation circuit 324 delays the strobe signal by a ¼ cycle to generate a latch signal a, and also generates a latch signal b that is complementary to the latch signal a (i.e., the latch signal b is delayed from the strobe signal by a ¾ cycle).

Figure 14:
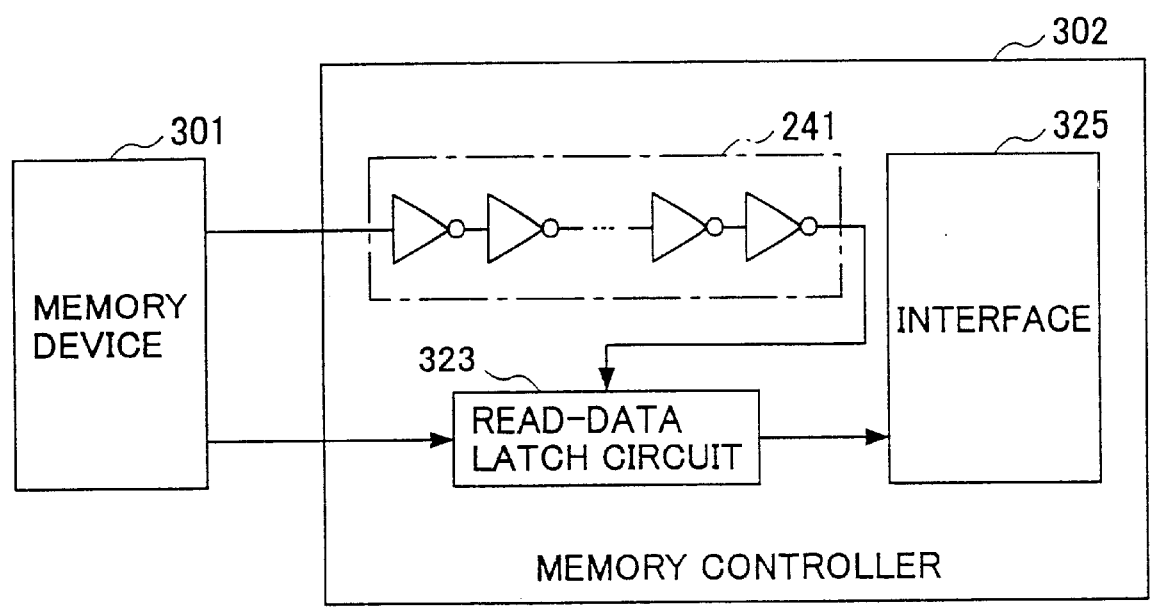
FIG. 14 is a block diagram of a related-art configuration of a latch-signal generation circuit of a memory controller.

FIG. 14 is a block diagram of a related-art configuration of the latch-signal generation circuit of the memory controller 302. In this circuit, a delay line 241 is provided to delay the strobe signal by a delay length as described above. The delay line 241 includes inverters connected in series, and a delay can be adjusted by selecting the position at which an output is taken out of the delay line 241. By taking into account the clock cycle and delays of various portions in the memory system, the delay of the delay line 241 is determined.

Although the delay of the delay line 241 is selectable, a delay that is once selected will be fixed. Further, the delay needs to be determined by taking into account the clock cycle and the delays of various portions with respect to each specific memory system, which requires excessive time and labor. Moreover, if the delay of the delay line 241 or the delays of various portions change due to temperature changes, power-supply-voltage fluctuation, etc., the latch signal may be deviated from the optimum latch timing.

It should be noted that the latch-signal generation circuit 311 of the memory device 301 shown in FIG. 12 needs a delay circuit similar to the one described above. The delay line 241 of FIG. 14 may be used in the latch-signal generation circuit 311. In such a configuration, however, the delay is fixed, which gives rise to a need that use of the memory device is limited to use with a particular clock frequency. This thus sacrifices universal applicability of the device.

In order to obviate the problem described above, Japanese Patent Laid-open Application No. 10-228449 teaches a memory device having a latch-signal generation circuit, which includes a variable delay line having a variable delay and a dummy delay line that is equivalent to the variable delay line, wherein feedback control is carried out to achieve an optimum latch timing by comparing the phase of a clock signal with the phase of a dummy signal delayed by the dummy delay line. Japanese Patent Laid-open Application No. 10-228449 further teaches providing a plurality of variable delay lines where one variable delay line receives an output of another variable delay line provided at a preceding stage, and each variable delay line is commonly controlled with respect to the delay thereof. In this configuration, phase control is attended to so as to make the output of the variable delay lines have the same phase as the clock signal, thereby generating a signal having a predetermined phase shift. If the configuration disclosed in the Japanese Patent Laid-open Application No. 10-228449 is applied to the latch-signal generation circuit of the memory controller, it is possible to generate a latch signal that is applicable to any memory system of any configuration, and that is optimum at all times even if there is temperature variation.

The configuration disclosed in the Japanese Patent Laid-open Application No. 10-228449, however, includes a plurality of variable delay lines, which is undesirable in that the circuit becomes complex and large. Further, a plurality of variable delay lines arranged in series has a minimum adjustable delay length that is a multiple of the delay of one delay stage of each variable delay line. If four variable delay lines are provided in series, four signals are generated that have respective phases staggered by a ¼ cycle each. In this case, however, the minimum adjustable delay length is four times as long, so that precise adjustment cannot be made. Further, if the delay of one delay stage in each variable delay line is made shorter, the number of delay stages needs to be increased, resulting in a circuit-size increase.

As described above, the configuration as shown in FIG. 3 which uses a delay line for delay setting offers only a fixed delay, and the delay setting needs to be made with respect to each specific memory system, which is laborious and time consuming, and, also, gives rise to a problem that the latch signal deviates from an optimum latch timing when the delay varies due to manufacturing process variation, temperature variation, power-supply-voltage variation, etc. Also, the configuration disclosed in the Japanese Patent Laid-open Application No. 10-228449 has a drawback in that the circuit becomes complex and large.

Accordingly, there is a need for a memory system that has a simple structure capable of latching data read from a memory device at optimum timing even if there is manufacturing process variation, temperature variation, power-supply-voltage variation, etc.

Figure 15:
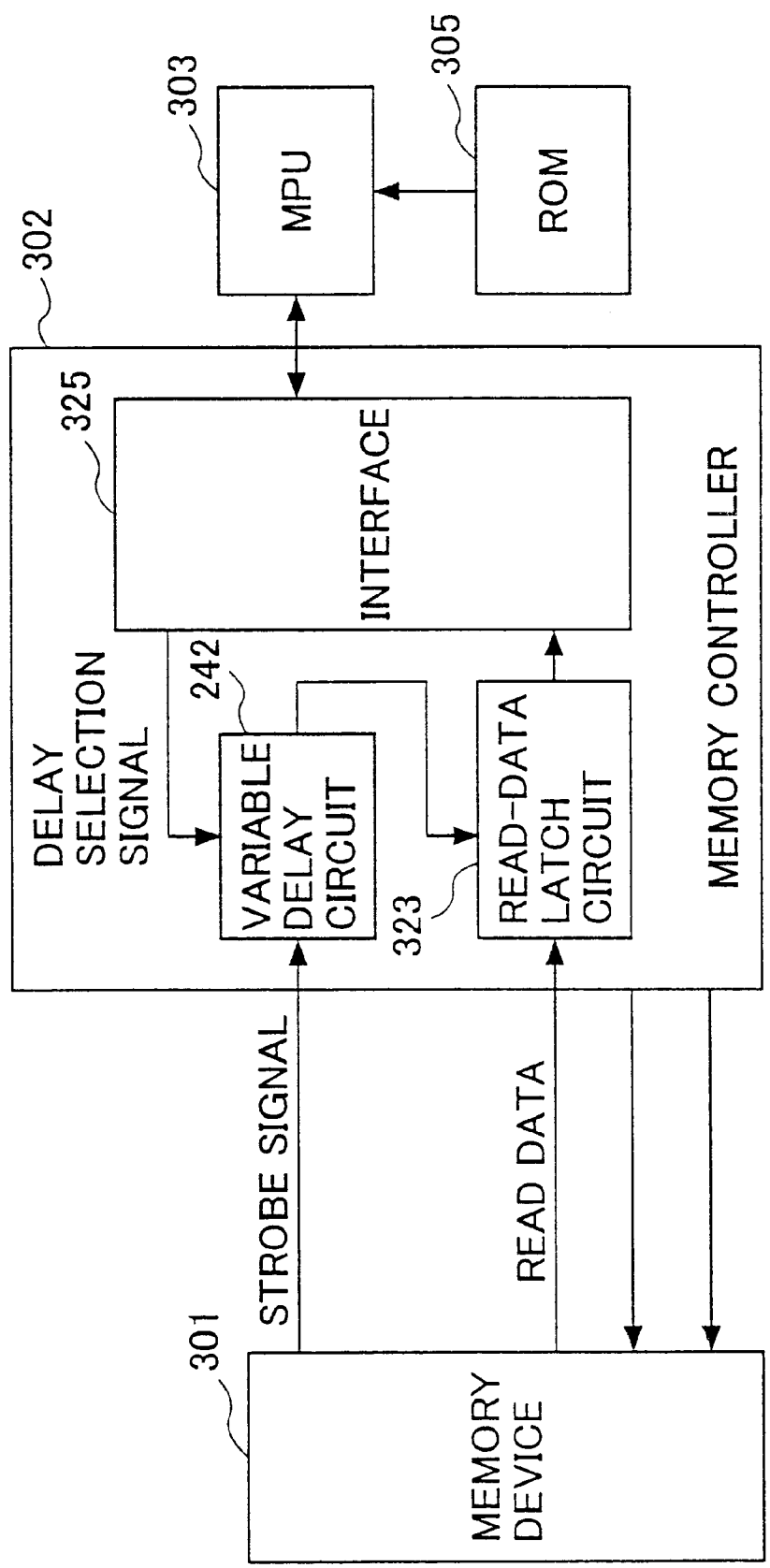
FIG. 15 is a block diagram of a memory system according to the present invention.

FIG. 15 is a block diagram of a memory system according to the present invention. As shown in the figure, the microprocessor (MPU) 303 is connected to the memory controller 302, which is connected to the double-data-rate (DDR) memory device 301. The MPU 303 accesses the DDR memory device 301 via the memory controller 302. The MPU 303 has a ROM 305 connected thereto where the ROM 305 stores a read-operation control program therein.

When the MFU 303 is to write date in the DDR memory device 301, the MPU 303 supplies control signals, address signals, and the write data to the interface 325 of the memory controller 302. The memory controller 302 generates control signals and address signals for the DDR memory device 301 based on the received control signals and the received address signals, and supplies the generated control signals and address signals together with the write data to the DDR memory device 301. When the MPU 303 is to read data from the DDR memory device 301, the MPU 303 supplies control signals and address signals to the interface 325 of the memory controller 302. The memory controller 302 then generates control signals and address signals for the DDR memory device 301 based on the received control signals and the received address signals, and supplies the generated control signals and address signals to the DDR memory device 301. In response, the DDR memory device 301 outputs data such that the data exhibits changes in synchronization with both the rising edges and the falling edges of the strobe signal as shown in FIG. 13B, and, also, the strobe signal is output together with the data.

A variable delay circuit 242 of the memory controller 302 delays a strobe signal to generate a latch signal. The latch circuit 323 latches the read data in response to the latch signal. The latched data is read by the MPU 303 via the interface 325. The variable delay circuit 242 is configured to allow a delay thereof to be selected by a delay selection signal that is input via the interface 325 from the MPU 303.

The ROM 305 stores therein a program for setting the delay selection signal, which is supplied to the variable delay circuit 242. This program is executed at the time of power-on of the memory system and at constant intervals thereafter. Namely, the MPU 303 and the program stored in the ROM 305 together form a means to select a delay (i.e., the delay selection means or the delay selection unit). This means to select a delay may as well be implemented by hardware circuitry.

Figure 16:
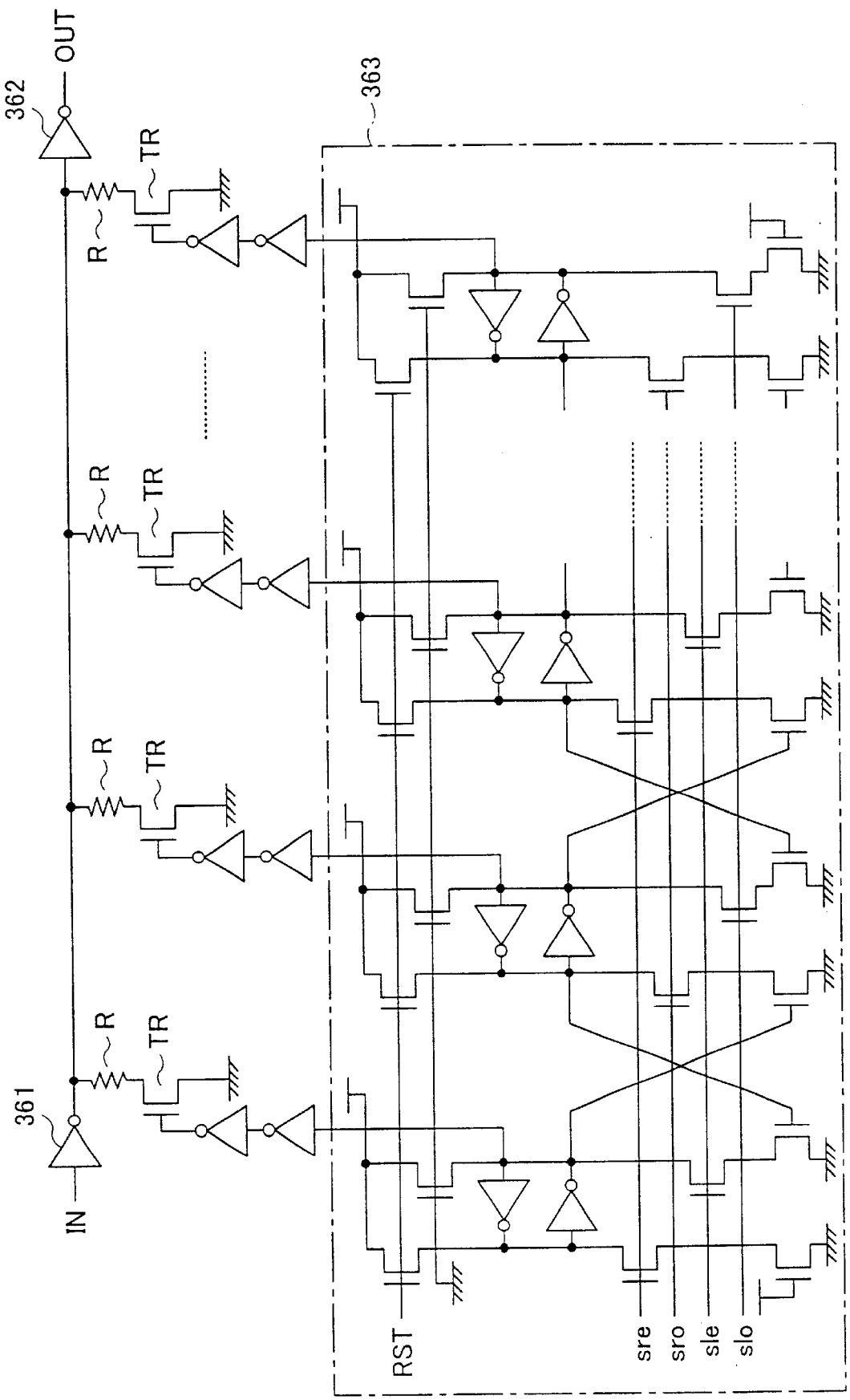
FIG. 16 is a circuit diagram showing the configuration of a variable delay circuit.

FIG. 16 is a circuit diagram showing the configuration of the variable delay circuit 242. The variable delay circuit delays a signal IN (strobe signal) that passes through two inverters 361 and 362, thereby producing a signal OUT. The delay is adjusted by changing capacitance coupled to the signal line that connects between the two inverters 361 and 362. As shown in the figure, the signal line that connects between the two inverters 361 and 362 has a plurality of sets of registers R and transistors TR connected thereto where each set is comprised of one register R and one transistor TR connected in series. As the number of transistors that are made conductive changes, the capacitance coupled to the signal line also changes.

A circuit portion indicated by reference number 363 is a shift register. As the reset signal RST becomes HIGH, flip-flops each constituting a register of a corresponding stage are all placed in the same conditions, in which the an output of each register applied to the gate of the transistor TR is set equal to LOW, thereby making all the transistors TR nonconductive.

Figure 17A:
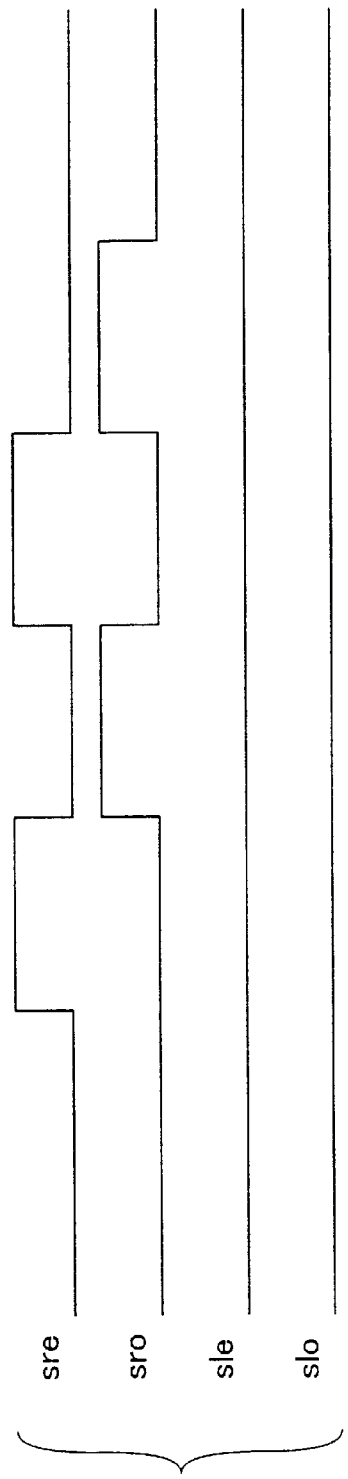
FIGS. 17A and 17B are timing charts for explaining operation of the circuit of FIG. 16.
Figure 17B:
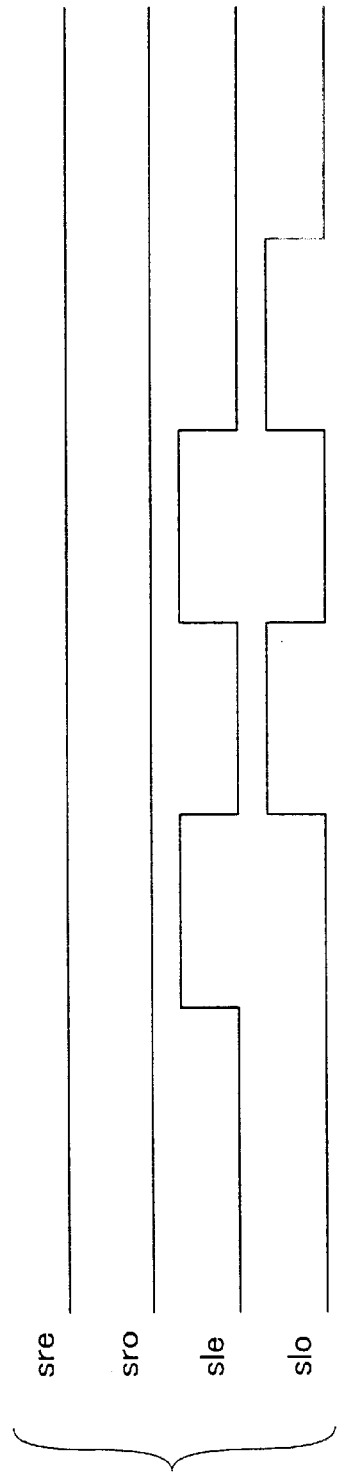

FIGS. 17A and 17B are timing charts showing operation of the circuit of FIG. 16. As shown in FIG. 17A, when a control signal are generated from the delay selection signal is set equal to HIGH (all other control signals sro, sle, and slo remain LOW), the output of the first register becomes HIGH, thereby making the transistor TR conductive at the first stage. Since the other transistors TR remain nonconductive, the overall capacitance changes by one stage's worth of capacitance, resulting in a slight increase in the delay of the output signal OUT. When the control signal sro is changed to HIGH, the output of the second register is also changed to HIGH, thereby making the second-stage transistor TR conductive. Since the output of the first register remains HIGH, and the outputs of the third and following registers remain LOW, the overall capacitance ends up having two stages' worth of capacitance increases, thereby delaying the output signal OUT slightly more. In the same manner, the control signals sre and sro are alternately changed to HIGH so as to make the transistors TR conductive one after another from left to to the right, thereby successively increasing the capacitance coupled to the signal line to increase the delay of the output signal OUT.

When the control signals sle and slo are alternately changed to HIGH as shown in FIG. 17B (the other control signals sre and sro remain LOW) while some of the transistors TR are in the conductive state, the transistors TR in the conductive state are successively made nonconductive from the right, thereby gradually decreasing the capacitance coupled to the signal line to reduce the delay of the output signal OUT. In this manner, the variable delay circuit of FIG. 16 delays the input signal (strobe signal) IN by a delay specified by the delay selection signal, thereby producing the output signal OUT.

Figure 18:
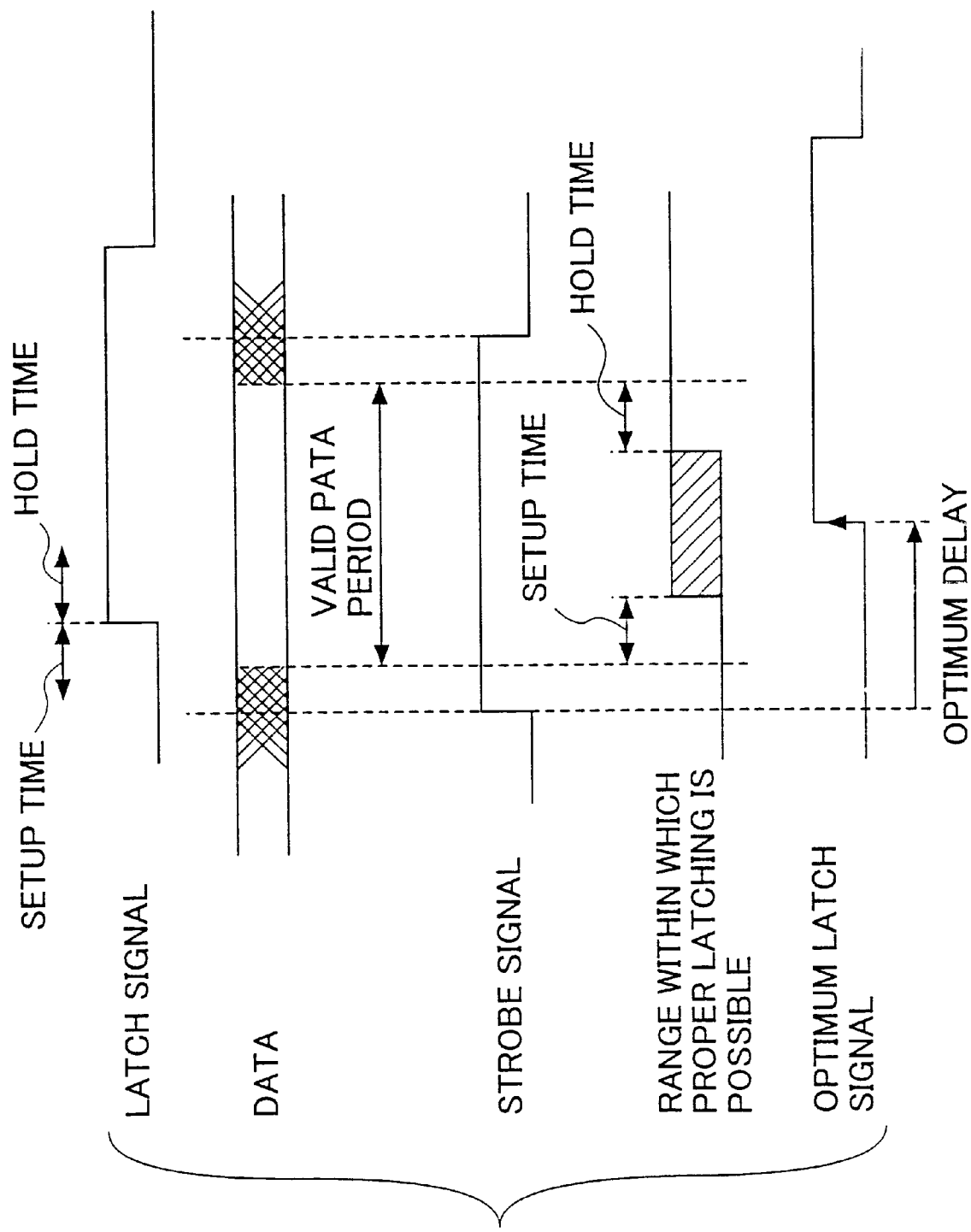
FIG. 18 is a timing chart for explaining optimum latch timing.

FIG. 18 is a timing chart for explaining optimum latch timing. The latch circuit latches data at a rising edge of the latch signal. In such a case, a time period during which the data needs to be stable before the rising edge is referred to as a setup time, and a time period during which the data needs to be stable after the rising edge is referred to as a hold time. Since the memory device of this embodiment is that of a DDR type, data changes at rising edges and falling edges of the strobe signal. In FIG. 12, the memory device 301 includes an output timing adjustment circuit for controlling the data to change exactly at the rising edges and falling edges of the strobe signal. Nonetheless, the data and the strobe signal are displaced from each other to some extent because of a circuit variation, a time difference in signal propagation from the DDR memory device 301 to the memory controller 302, etc. As a result, a time period during which data acquisition is reliably performed is actually shorter than a time period between the two edges, and is referred to as a data-valid period. When the setup time and the hold time are taken into consideration with respect to the data valid period, then, a range during which a valid latch operation is possible ends up being a range as shown by hatching in FIG. 18. In this embodiment, the latch signal is adjusted so as to rise at the midpoint of this hatched range.

Figure 19:
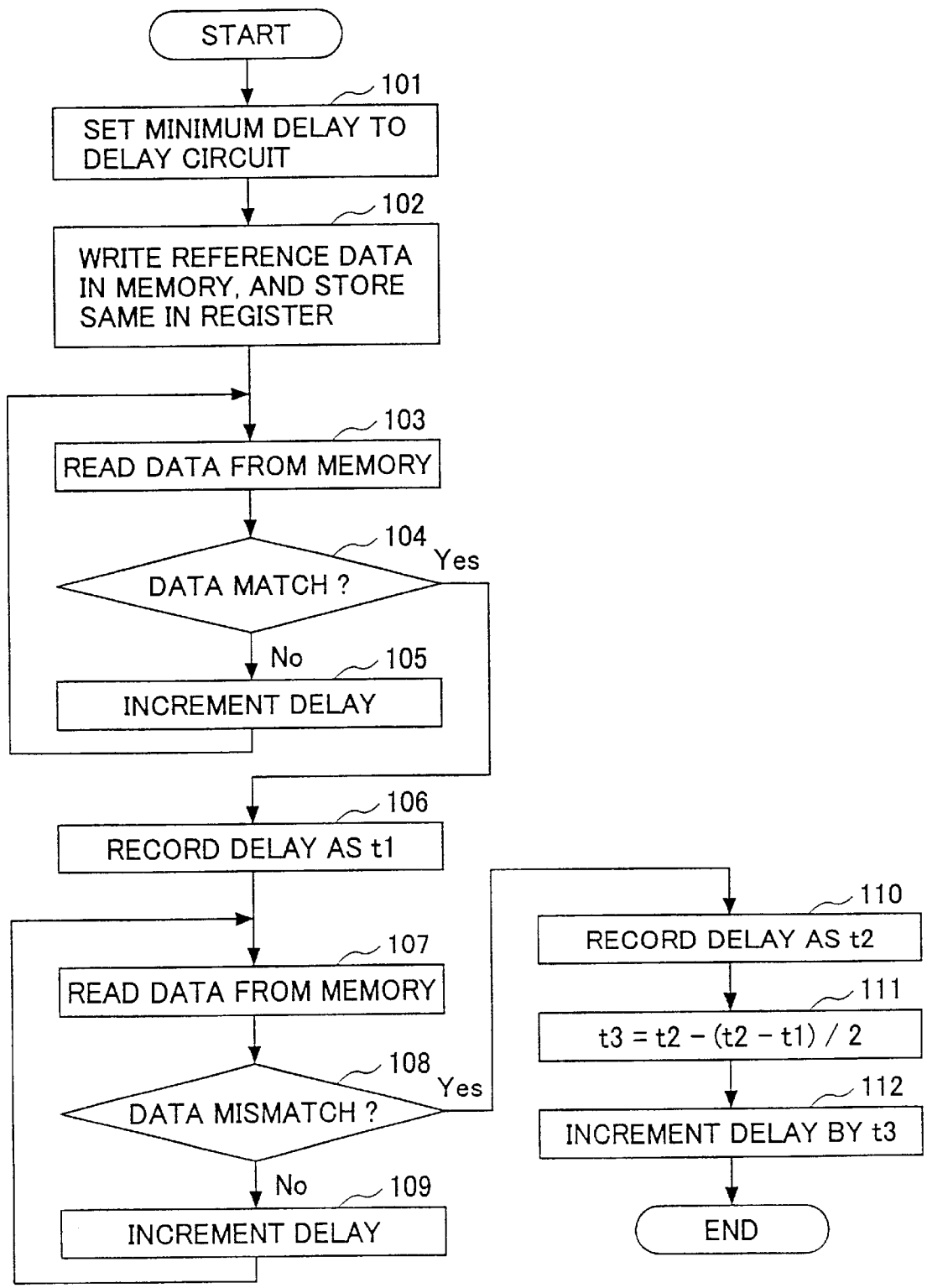
FIG. 19 is a flowchart showing a procedure by which a delay is set by a delay selection means comprised of an MPU and a program stored in a ROM.
Figure 20A:
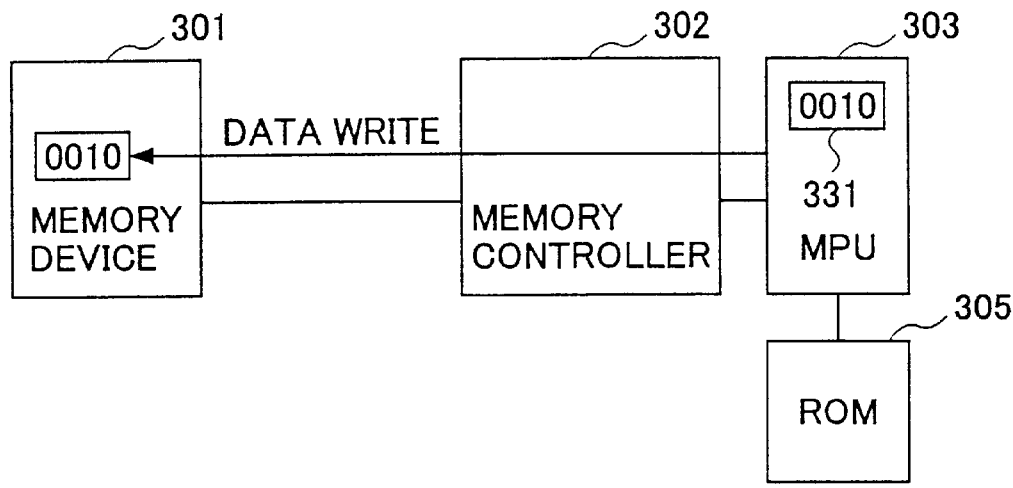
FIGS. 20A and 20B are illustrative drawings for explaining operations for checking correct read timing.
Figure 20B:
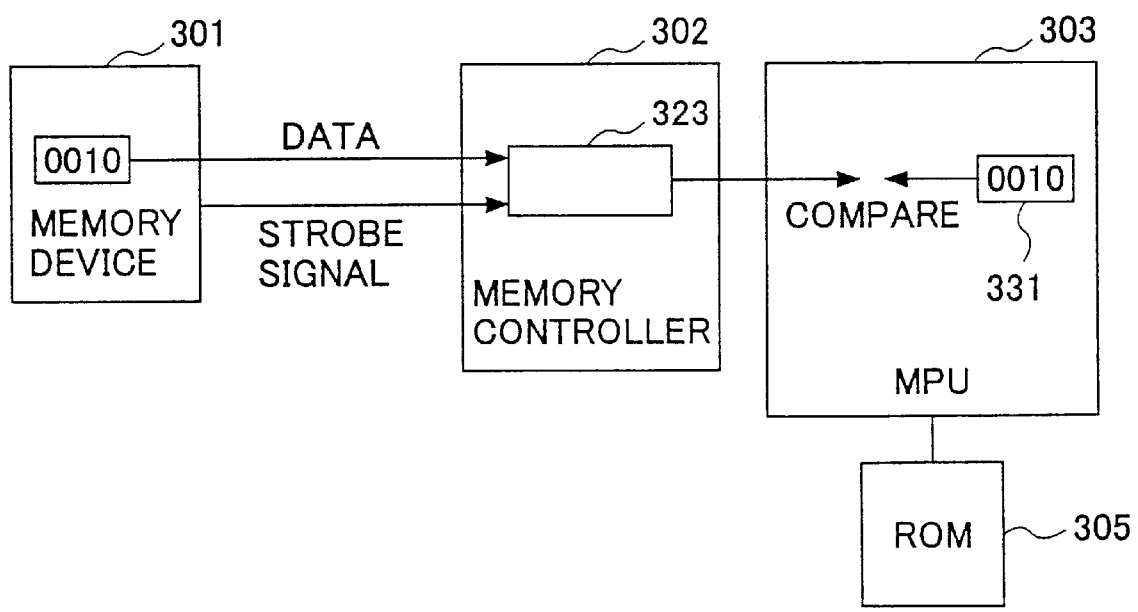

FIG. 19 is a flowchart showing a procedure by which a delay is set by the delay selection means comprised of the MPU 303 and the program stored in the ROM 305. FIGS. 20A and 20B are illustrative drawings for explaining operations for checking correct read timing. FIGS. 21 through 24 are timing charts for explaining data read operations during an adjustment process and after the completion of adjustment. In the following, the procedure for setting a delay will be described with reference to these drawings.

At step 101, the reset signal RST is input to the variable delay circuit 242 of FIG. 16, so that the delay of the variable delay circuit 242 is set to the minimum setting thereof. At step 102, as shown in FIG. 20A, the MPU 303 reads reference data from the ROM 305, and writes the data in the memory device 301 via the memory controller 302. Also, the data is stored in a register 331 of the MPU 303. In this example, the reference data is "0010".

At step 103, as shown in FIG. 20B, the MPU 303 reads the reference data that has just been stored from the memory device 301 via the memory controller 302. That is, the memory device 301 outputs the reference data in synchronization with the strobe signal, and the latch circuit 323 of the memory controller 302 latches the reference data in response to the latch signal supplied from the variable delay circuit 242. The reference data that is latched is then supplied to the MFU 303.

At step 104, the MPU 303 compares the obtained reference data with the reference data stored in the register 331, and checks whether they match. The delay of the variable delay circuit 242 was set to the minimum setting thereof at step 101, so that the latch signal is slightly delayed behind the strobe signal as shown in FIG. 21. As was described in connection with FIG. 13B, there are two latch signals having a 180-degree phase difference in the case of the DDR memory device. In the description of this embodiment, however, a description will be given by assuming that the data is latched at a rising edge and a falling edge of a single latch signal for the sake of simplicity of explanation. As shown in FIG. 21, edges of the latch signal are situated immediately after data changes, providing an insufficient setup time. Because of this, the obtained reference data is mistaken as "0001", which is identified as failing to match the correct reference data stored in the register. At step 105, the delay of the variable delay circuit 242 is increased by one stage in response to the delay selection signal. In detail, the control signal sre or sro shown in FIG. 16 is changed to HIGH. Thereafter, the procedure goes back to step 103, and the operations from step 103 to step 105 will be repeated.

Figure 22:
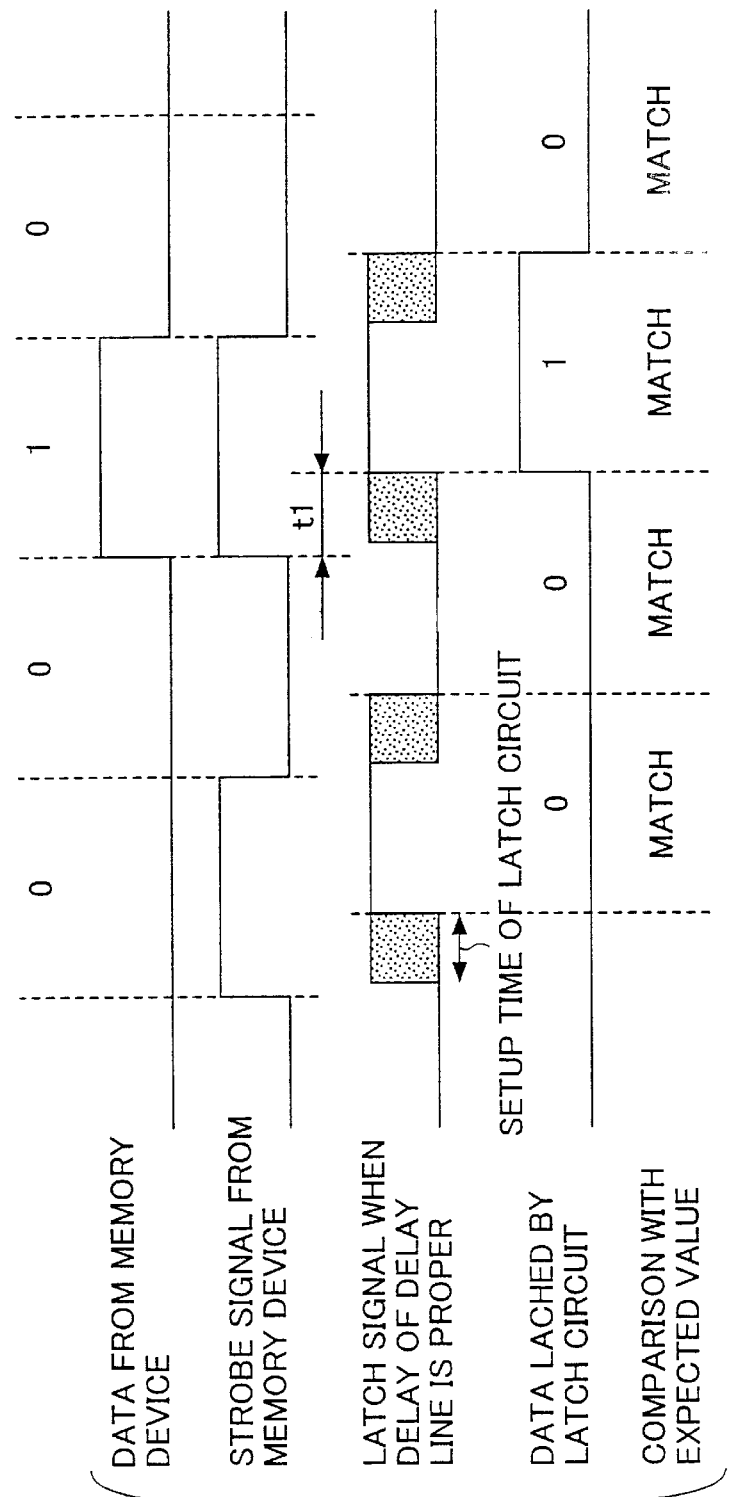
FIG. 22 is a timing chart for explaining data read operations during a delay adjustment process.

By repeating the operations as described above, the delay of the variable delay circuit 242 is increased, eventually resulting in the latch signal being adjusted to change after the passage of the setup time following data changes. When this is achieved, the obtained reference data is "0010" as shown in FIG. 22, and is identified at step 104 as matching the correct reference data stored in the register The procedure in this case goes to step 106, at which the current delay is stored as a delay t1.

At step 107, the reference data is read from the memory device 301 in the same manner as was read at step 103. At step 108, a check is made as to whether the obtained reference data fails to match the reference data stored in the register 331. If they match, the procedure goes to step 109, at which the delay of the variable delay circuit 242 is increased by one stage. Thereafter, the procedure goes back to step 107, and the operations of steps 107 through 109 will be repeated.

Figure 23:
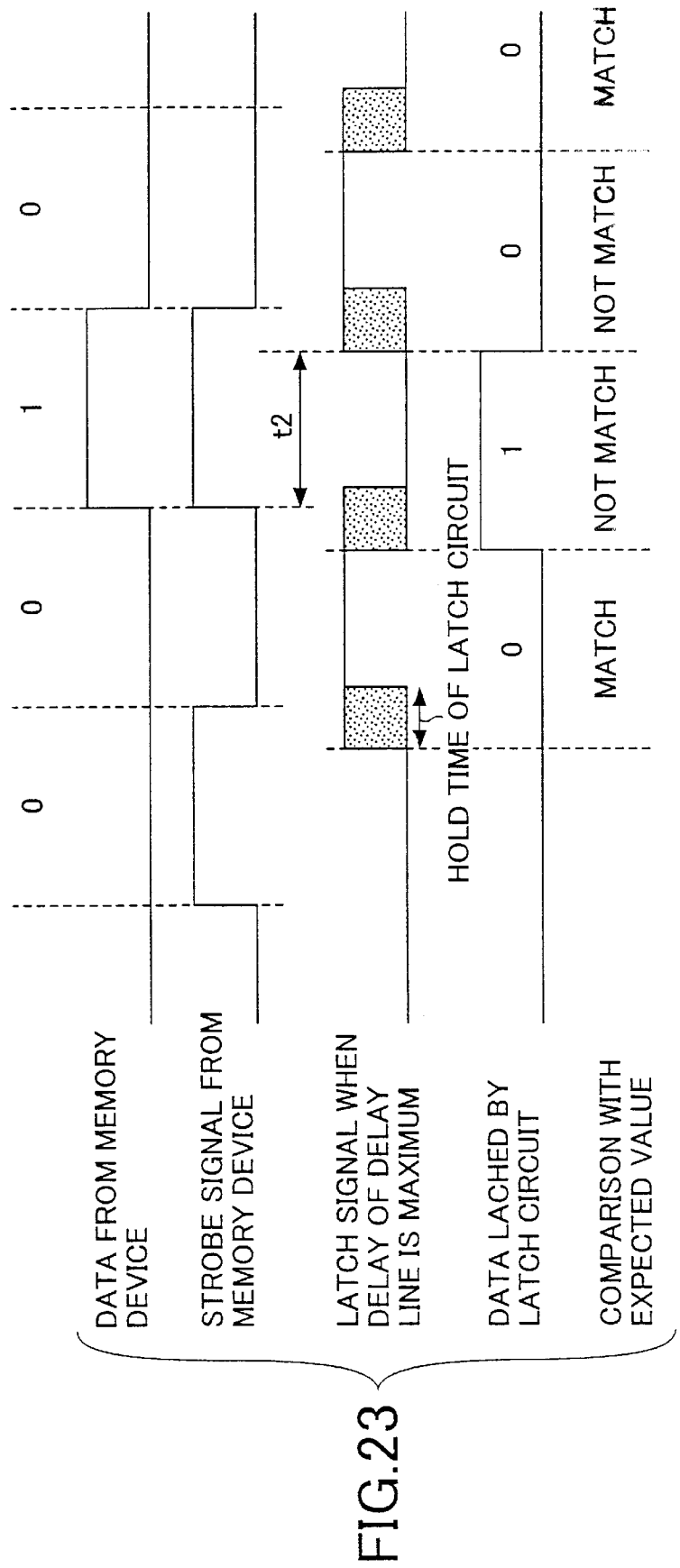
FIG. 23 is a timing chart for explaining data read operations during a delay adjustment process.

By repeating the operations as described above, the delay of the variable delay circuit 242 is increased, eventually resulting in the latch signal being adjusted such as to have a data change less the hold time after the latch signal change. When this is achieved, the obtained reference data is "0100" as shown in FIG. 23, and is identified at step 108 as failing to match the correct reference data stored in the register. The procedure in this case goes to step 110, at which the current delay is stored as a delay t2. The delays t1 and t2 demarcate a range of the delay of the variable delay circuit 242 within which proper read operation is performed.

Figure 24:
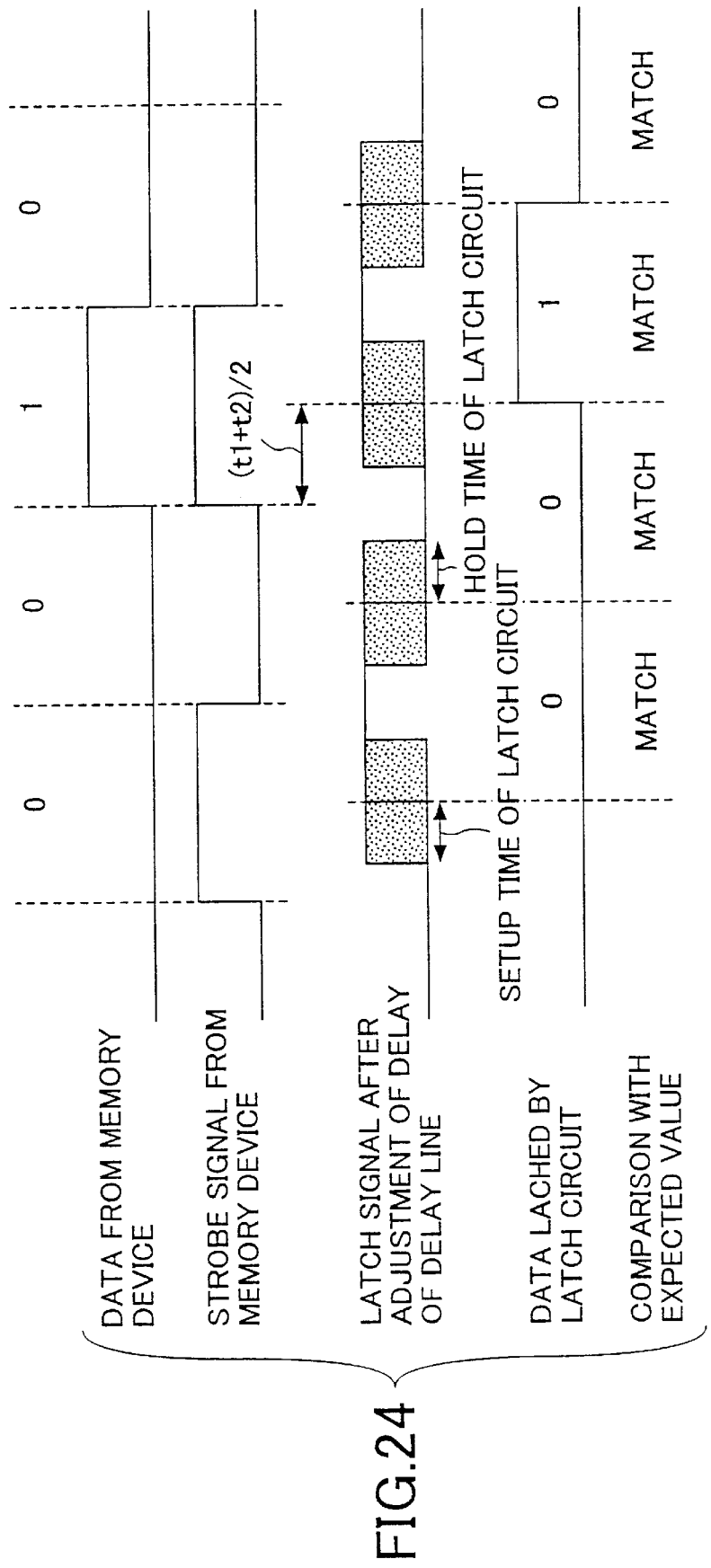
FIG. 24 is a timing chart for explaining a data read operation after the completion of delay adjustment.

At step 111, a delay t3 is obtained as:

$t3=t2-(t2-t1)/2$. At step 112, the delay of the variable delay circuit 242 is decreased exactly by the delay t3. After this adjustment, the latch signal maintains relationship with the data as shown in FIG. 24, in which the delay is positioned at the midpoint of the range that extends from the delay t1 to the delay t2. This puts an end to the delay setting procedure. The adjusted delay is kept as it is. When the program for setting the delay selection signal stored in the ROM 305 is activated at constant intervals, the delay adjusted at every turn will be maintained until the next following delay setting operation.

Figure 25:
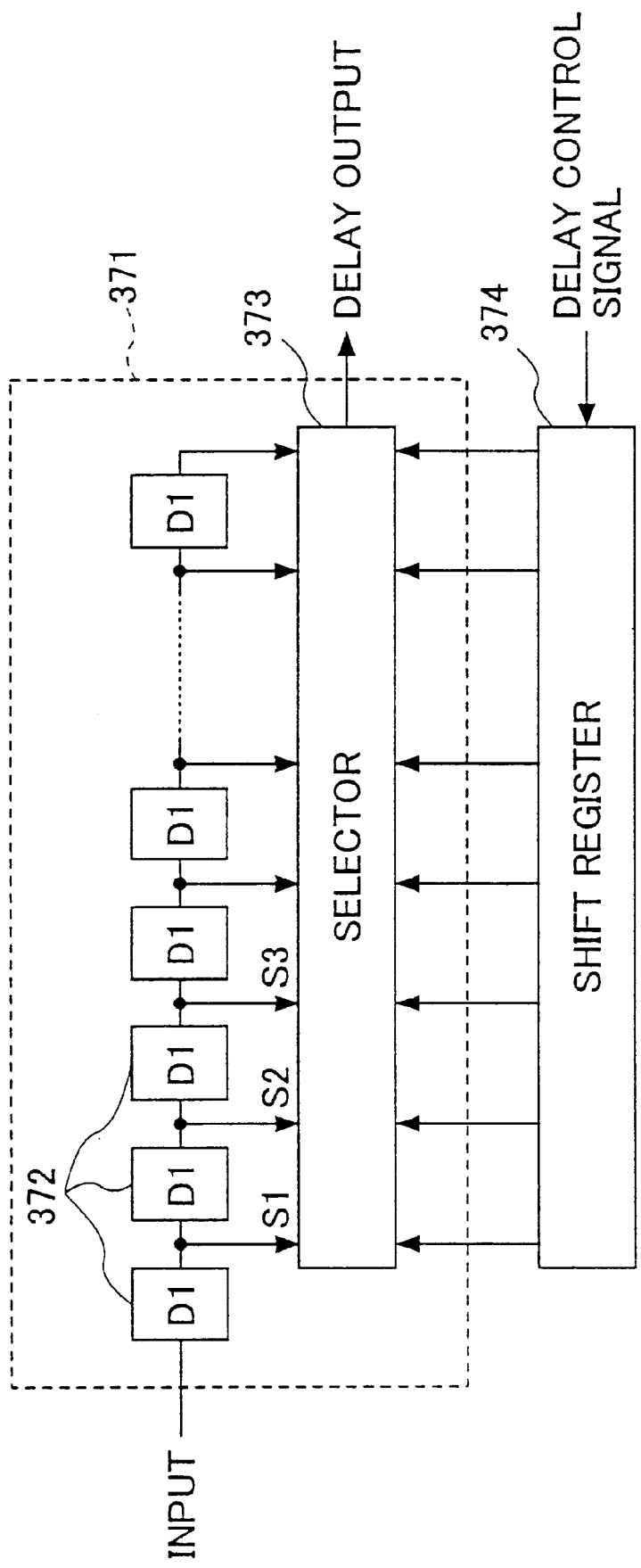
FIG. 25 is a block diagram of a variable delay circuit used in the present invention.

The present invention has been described above by way of a particular example, but may include various variations. For example, instead of using the variable delay circuit of FIG. 16, a variable delay circuit as shown in FIG. 25 and as disclosed in Japanese Patent Laid-open Application No. 10-228449 may be employed. This variable delay circuit includes a delay line comprised of a plurality of delay elements 372 connected in series and a selector 373 that selects one of the outputs of the delay elements 372. Further, the variable delay circuit includes a shift register 374 that indicates the point where the output is selected by the selector 373, thereby adjusting the delay by changing the number of relevant delay elements 372 in response to the position of selection. It should be noted that such a variable delay circuit may be implemented by using the circuit structures shown in FIG. 6 and FIG. 7.

As described above, the present invention can implement a memory system having a simple structure that can latch data at optimum timing as the data is read from a memory device, and can also set the latch timing to the optimum timing even if there is manufacturing variation, temperature variation, power-supply-voltage variation, etc. The present invention can thus achieve a memory system at low costs that is capable of high speed data read operations.

Further, the present invention is not limited to these embodiments, but various variations and modifications may be made without departing from the scope of the present invention.

The present application is based on Japanese priority application no. 2000-148480 filed on May 19, 2000 and Japanese priority application no. 2000-158336 filed on May 29, 2000 with the Japanese patent office, the entire contents of which are hereby incorporated by reference.

What is claimed is:

1. A memory controller for controlling a double data rate memory that is connected thereto and outputs data together with a strobe signal comprising:
    a clock signal generation circuit which generates a clock signal supplied to the memory; and
    a data acquisition circuit which delays the strobe signal through feedback control that makes a delay substantially equal to a ¼ cycle of the clock signal, and which latches the data in response to a timing signal using the delayed strobe signal.

2. A memory controller as claimed in claim 1, wherein said data acquisition circuit includes:
    a variable delay circuit which delays the strobe signal by a ¼ cycle of the clock signal; and
    a latch circuit which latches the data in response to the timing signal that is the delayed strobe signal supplied from the variable delay circuit.

3. The memory controller as claimed in claim 2, wherein said data acquisition circuit includes:
    one or more variable delay circuits which are connected in series, and each of which is controlled to have a delay identical to a delay of said variable delay circuit; and
    a phase comparison circuit which detects a total delay of said one or more variable delay circuits by using the clock signal as a reference,
    wherein the delay of each of said one or more variable delay circuits and the delay of said variable delay circuit are controlled based on the total delay detected by said phase comparison circuit.

4. The memory controller as claimed in claim 3, wherein said data acquisition circuit further includes a delay control circuit which generates a control signal for controlling the delay of each of said one or more variable delay circuits and the delay of said variable delay circuit based on the total delay detected by said phase comparison circuit.

5. The memory controller as claimed in claim 3, wherein information about the total delay detected by said phase comparison circuit is sent to an exterior of said memory controller, and a control signal for controlling the delay of each of said one or more variable delay circuits and the delay of said variable delay circuit is received from the exterior of said memory controller.

6. The memory controller as claimed in claim 3, wherein said one or more variable delay circuits includes a series of four circuits each controlled to have the delay identical to the delay of the variable delay circuit, and receives the clock signal so as to delay the clock signal by a delay four times as long as the delay of the variable delay circuit, and wherein said phase comparison circuit compares phases between the clock signal and the delayed clock signal delayed by said one or more variable delay circuits.

7. The memory controller as claimed in claim 3, wherein said one or more variable delay circuits includes a series of two circuits each controlled to have the delay identical to the delay of the variable delay circuit, and receives the clock signal so as to delay the clock signal by a delay twice as long as the delay of the variable delay circuit, and wherein said phase comparison circuit compares phases between an inverse of the clock signal and the delayed clock signal delayed by said one or more variable delay circuits.

8. The memory controller as claimed in claim 3, wherein said one or more variable delay circuits includes a series of two circuits each controlled to have the delay identical to the delay of the variable delay circuit, and receives a double-frequency signal having double a frequency of the clock signal so as to delay the double-frequency signal by a delay twice as long as the delay of the variable delay circuit, and wherein said phase comparison circuit compares phases between the double-frequency signal and the delayed double-frequency signal delayed by said one or more variable delay circuits.

9. The memory controller as claimed in claim 3, wherein said one or more variable delay circuits includes a single circuit controlled to have the delay identical to the delay of the variable delay circuit, and receives a double-frequency signal having double a frequency of the clock signal so as to delay the double-frequency signal by the delay identical to the delay of the variable delay circuit, and wherein said phase comparison circuit compares phases between an inverse of the double-frequency signal and the delayed double-frequency signal delayed by said one or more variable delay circuits.

10. A system, comprising:
    a double data rate memory which outputs data together with a strobe signal;
    a memory controller which receives that data and the strobe signal, and controls said memory;
    a clock signal generation circuit which generates a clock signal supplied to the memory; and
    a data acquisition circuit, provided in said memory controller, which delays the strobe signal through feed back control that makes a delay substantially equal to a ¼ cycle of the clock signal, and which latches the data in response to a timing signal using the delayed strobe signal.

11. A memory controller for controlling a memory device that outputs a strobe signal, and outputs data in synchronization with said strobe signal, comprising:
    a variable delay circuit that generates a latch signal by delaying the strobe signal, and latches the data in synchronization with the latch signal; and
    a delay selection unit which successively reads reference data of a given data value from said memory device while successively changing a delay of the variable delay circuit, and checks whether a value of the successively read reference data matches the given data value so as to obtain a range of said delay within which proper read operation is performed, thereby selecting the delay of the variable delay circuit based on the obtained range.

12. The memory controller as claimed in claim 11, wherein said delay selection unit includes a register that stores therein the reference data of the given data value, and wherein said delay selection unit writes the reference data in said memory device via said memory controller, and compares the reference data read from said memory device with the reference data stored in said register so as to check whether the value of the successively read reference data matches the given data value.

13. The memory controller as claimed in claim 11, wherein said delay selection circuit selects the delay such that the delay is provided at a midpoint of the obtained range.

14. The memory controller as claimed in claim 11, wherein said delay selection circuit selects the delay of the variable delay circuit at the time of power-on of said memory system, and maintains the selected delay thereafter.

15. The memory controller as claimed in claim 14, wherein said delay selection circuit selects the delay of the variable delay circuit at constant intervals after selecting the delay of the variable delay circuit at the time of power-on of said memory system, the delay selected at the constant intervals remaining the same until the delay is selected at the next turn of the constant intervals.

16. The memory controller as claimed in claim 14, wherein said delay selection circuit selects the delay of the variable delay circuit at constant intervals after selecting the delay of the variable delay circuit at the time of power-on of said memory system, the delay selected at the constant intervals remaining the same until the delay is selected at a next turn of the constant intervals.

17. A method of setting a delay of a variable delay circuit in a memory controller for controlling a memory device which outputs a strobe signal, and outputs data in synchronization with the strobe signal, said memory controller including the variable delay circuit that generates a latch signal by delaying the strobe signal, and latching the data in a synchronization with the latch signal, said method comprising the steps of:

successively reading reference data of a given data value from the memory device while successively changing a delay of the variable delay circuit;

checking whether a value of the successively read reference data matches the given data value so as to obtain a range of said delay within which proper read operation is performed; and selecting the delay of the variable delay circuit on the obtained range.

18. The method as claimed in claim 17, further comprising a step of storing the reference data in the memory device via the memory controller prior to said step of successively reading reference data.

19. The method as claimed in claim 17, further comprising a step of maintaining the selected delay after said method is performed at a time of power-on of the memory system.

20. The method as claimed in claim 19, further comprising a step of maintaining the selected delay until the delay is selected at an end of a next interval wherein said method is performed at a time of power-on of the memory system and at constant intervals thereafter.

* * * * *